(12) United States Patent
Vaidyanathan et al.

(10) Patent No.: US 9,257,988 B2
(45) Date of Patent: Feb. 9, 2016

(54) CONFIGURABLE DECODER WITH APPLICATIONS IN FPGAS

(71) Applicant: Board of Supervisors of Louisiana State University and Agricultural and Mechanical College, Baton Rouge, LA (US)

(72) Inventors: Ramachandran Vaidyanathan, Baton Rouge, LA (US); Matthew Jordan, Huntsville, AL (US)

( * ) Notice: Subject to any disclaimer, the term of this patent is extended or adjusted under 35 U.S.C. 154(b) by 0 days.

(21) Appl. No.: 14/478,856

(22) Filed: Sep. 5, 2014

(65) Prior Publication Data
US 2015/0002191 A1 Jan. 1, 2015

Related U.S. Application Data

(62) Division of application No. 12/310,817, filed as application No. PCT/US2007/018406 on Aug. 20, 2007, now Pat. No. 8,862,854.

(60) Provisional application No. 60/838,651, filed on Aug. 18, 2006.

(51) Int. Cl.
*G06F 12/10* (2006.01)
*H03K 19/177* (2006.01)
*H03K 19/173* (2006.01)

(52) U.S. Cl.
CPC ...... *H03K 19/17776* (2013.01); *H03K 19/1732* (2013.01); *H03K 19/17744* (2013.01); *H03K 19/17752* (2013.01); *H03K 19/17756* (2013.01)

(58) Field of Classification Search
CPC .................................................. G06F 12/1063
See application file for complete search history.

(56) References Cited

U.S. PATENT DOCUMENTS

2005/0248364 A1* 11/2005 Vadi et al. ................... 326/39

* cited by examiner

*Primary Examiner* — Yong Choe
(74) *Attorney, Agent, or Firm* — Jason P. Mueller; Adams and Reese LLP

(57) ABSTRACT

The invention relates to hardware decoders that efficiently expand a small number of input bits to a large number of output bits, while providing considerable flexibility in selecting the output instances. One main area of application of the invention is in pin-limited environments, such as field programmable gates array (FPGA) used with dynamic reconfiguration. The invention includes a mapping unit that is a circuit, possibly in combination with a reconfigurable memory device. The circuit has as input a z-bit source word having a value at each bit position and it outputs an n-bit output word, where n>z, where the value of each bit position of the n-bit output word is based upon the value of a pre-selected hardwired one of the bit positions in the x-bit word, where the said pre-selected hardwired bit positions is selected by a selector address. The invention may include a second reconfigurable memory device that outputs the z-bit source word, based upon an x-bit source address input to the second memory device, where x<z. The invention may produce the output n-bit, $\alpha$ bits at a time.

5 Claims, 21 Drawing Sheets

General structure of a mapping unit $MU(z, y, n, \alpha)$.

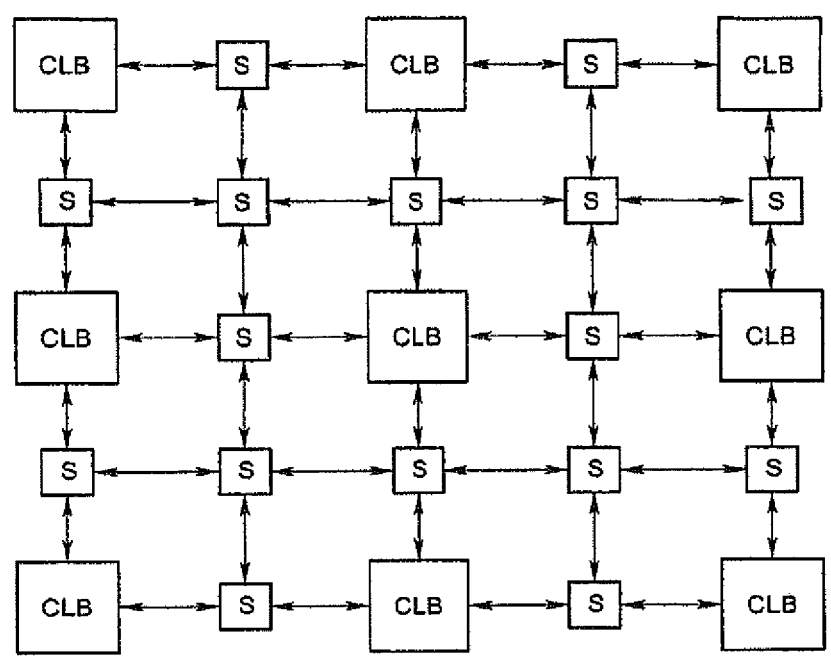
Figure 1: A typical FPGA structure.

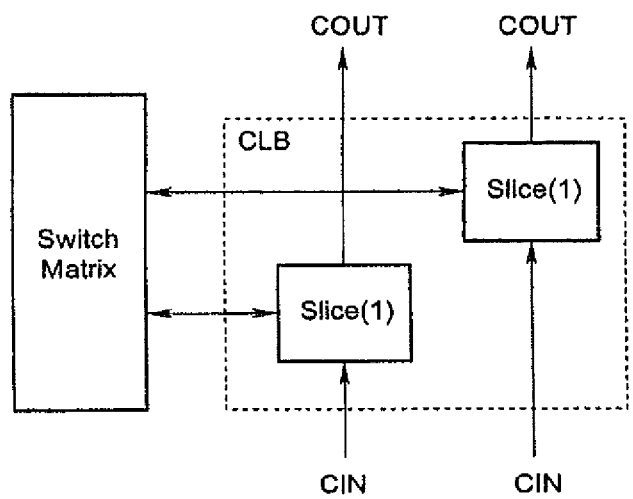
Figure 2: Xilinx Virtex 5 configurable logic block (CLB).

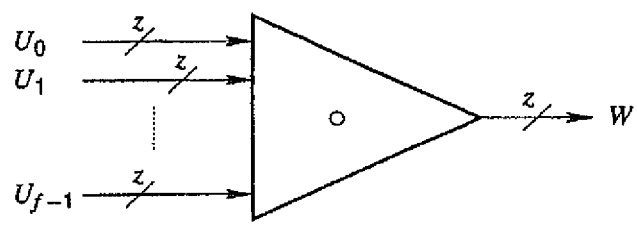
Figure 3: Fan-in of degree $f$ and width $w$.

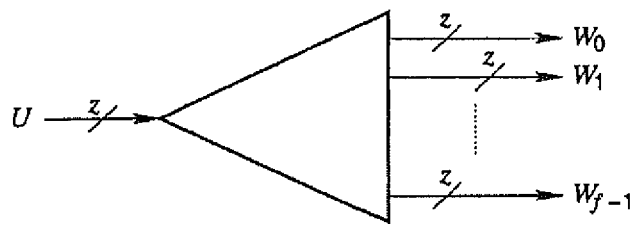
Figure 4: Fan-out of degree $f$ and width $w$.

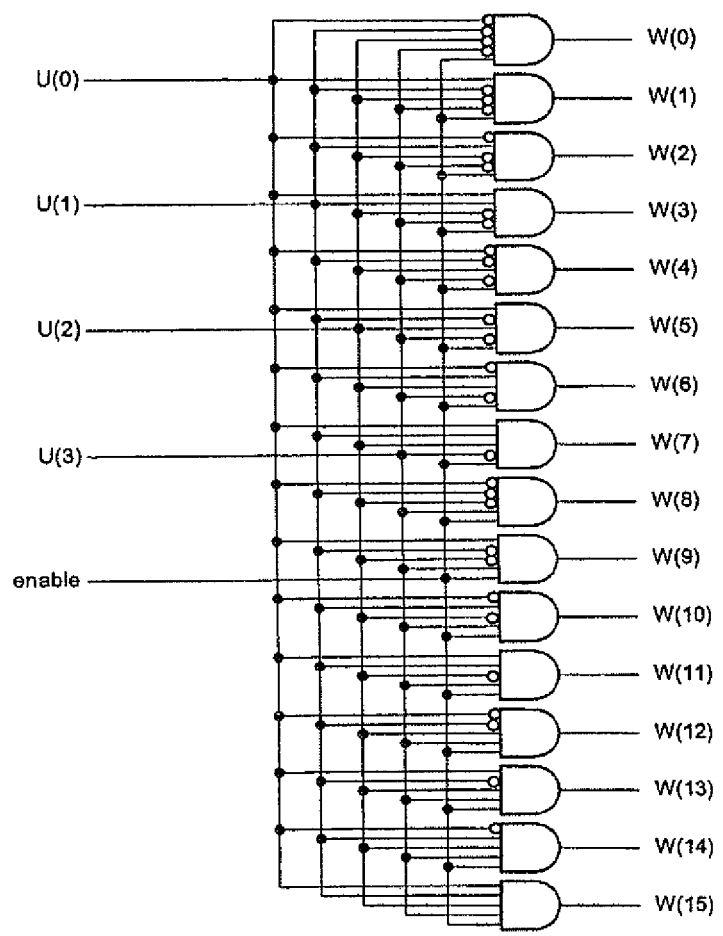
Figure 5: A typical implementation of a 4-to-16 decoder.

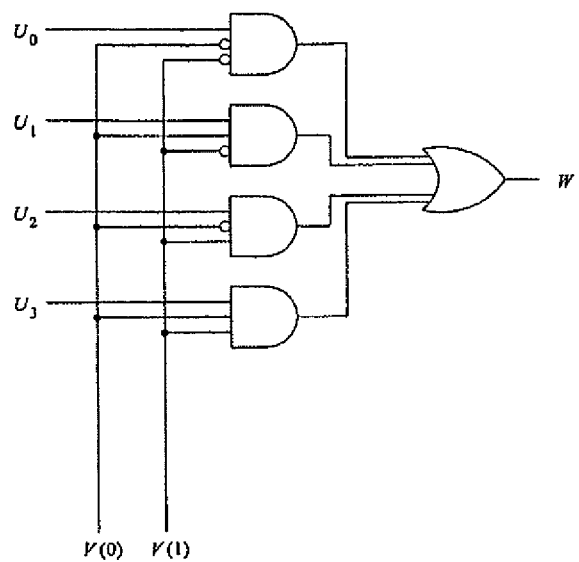
Figure 6: A typical implementation of a 4-to-1 multiplexer.

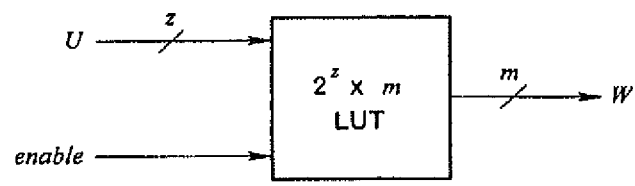
Figure 7: Structure of a $2^z \times m$ LUT.

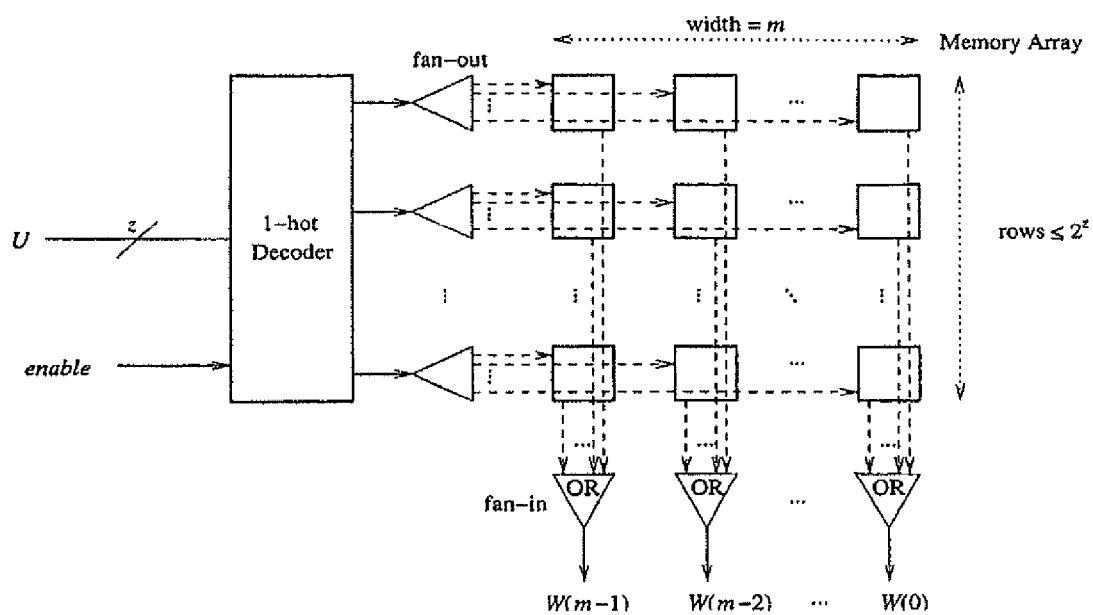
Figure 8: An implementation of a $2^z \times m$ LUT.

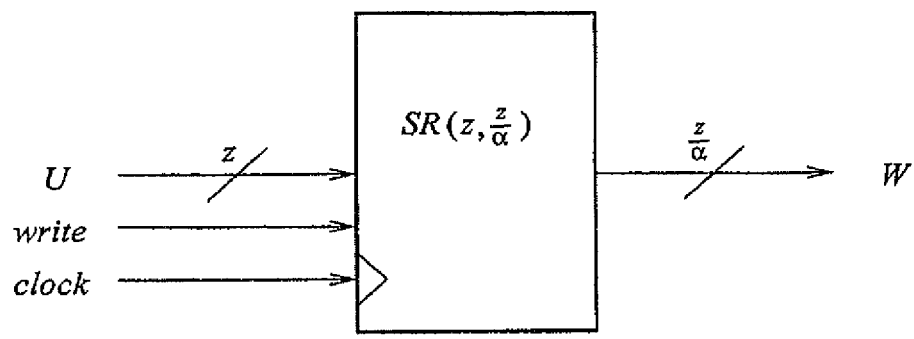
Figure 9: Structure of an $SR(z, \frac{z}{\alpha})$.

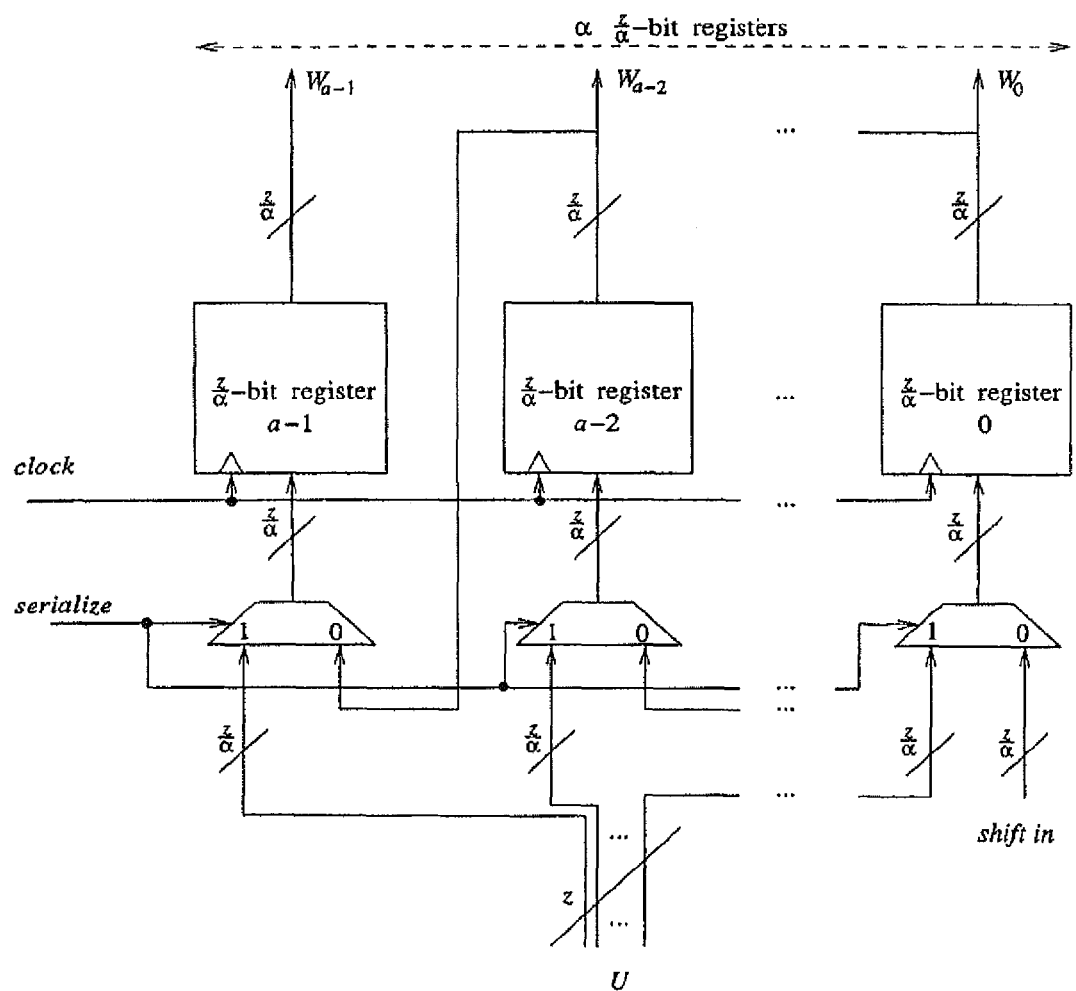
Figure 10: Implementation of an $SR(z, \frac{z}{\alpha})$

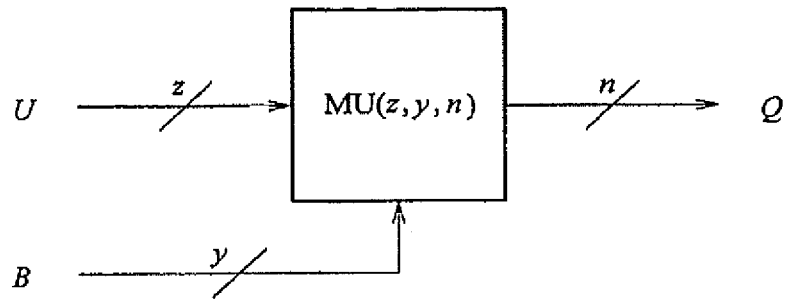
Figure 11: Block diagram of an $MU(z, y, n, \alpha)$.
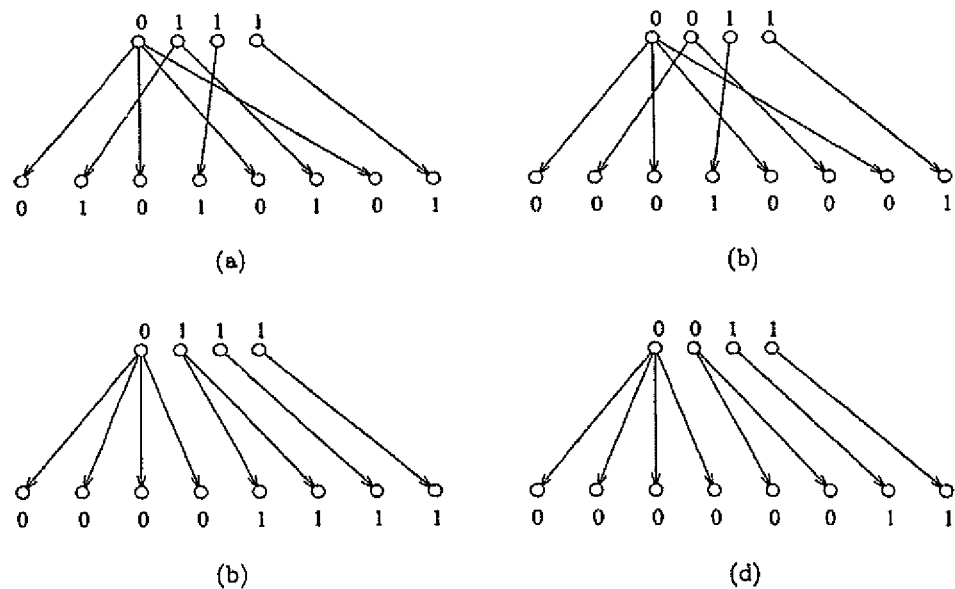
Figure 12: Multicast of 4 bits to 8 bits, for two different multicast schemes, each with different values.

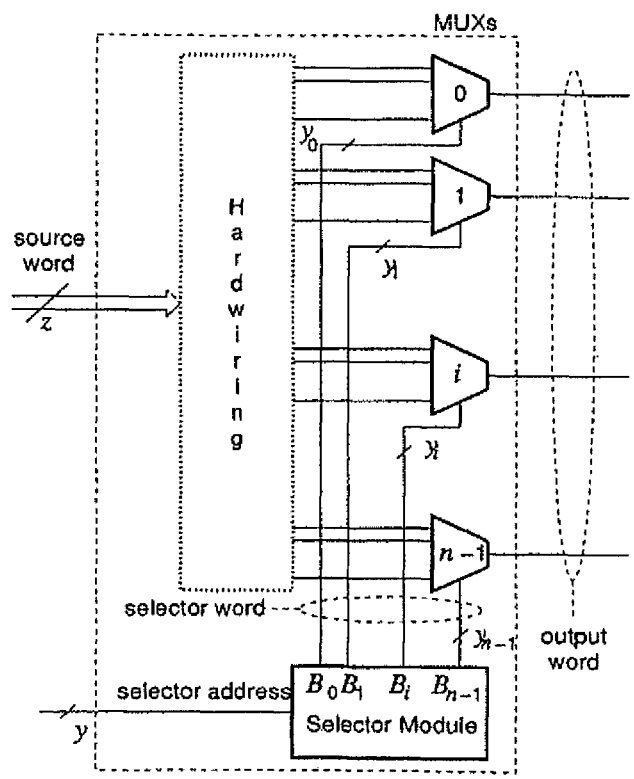
Figure 13: General structure of a mapping unit $MU(z, y, n, \alpha)$.

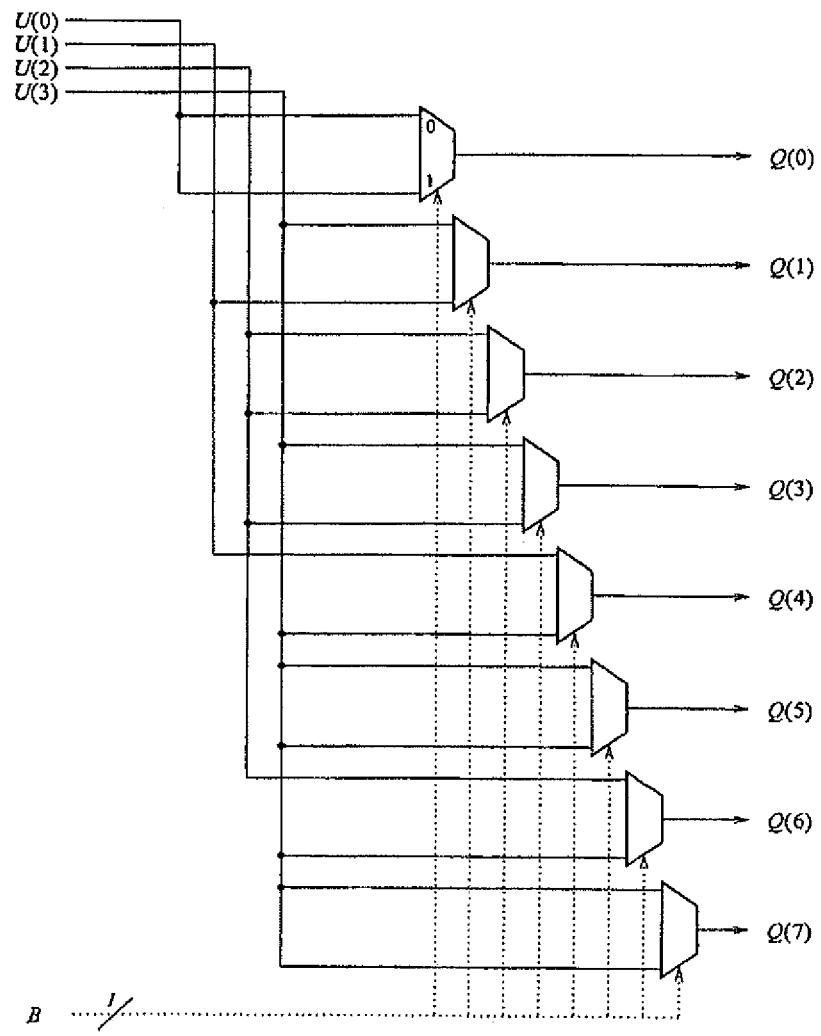
Figure 14: A fixed mapping unit $MU(4,1,8,1)$ that produces $S_0$ and $S_1$ of Table 2.

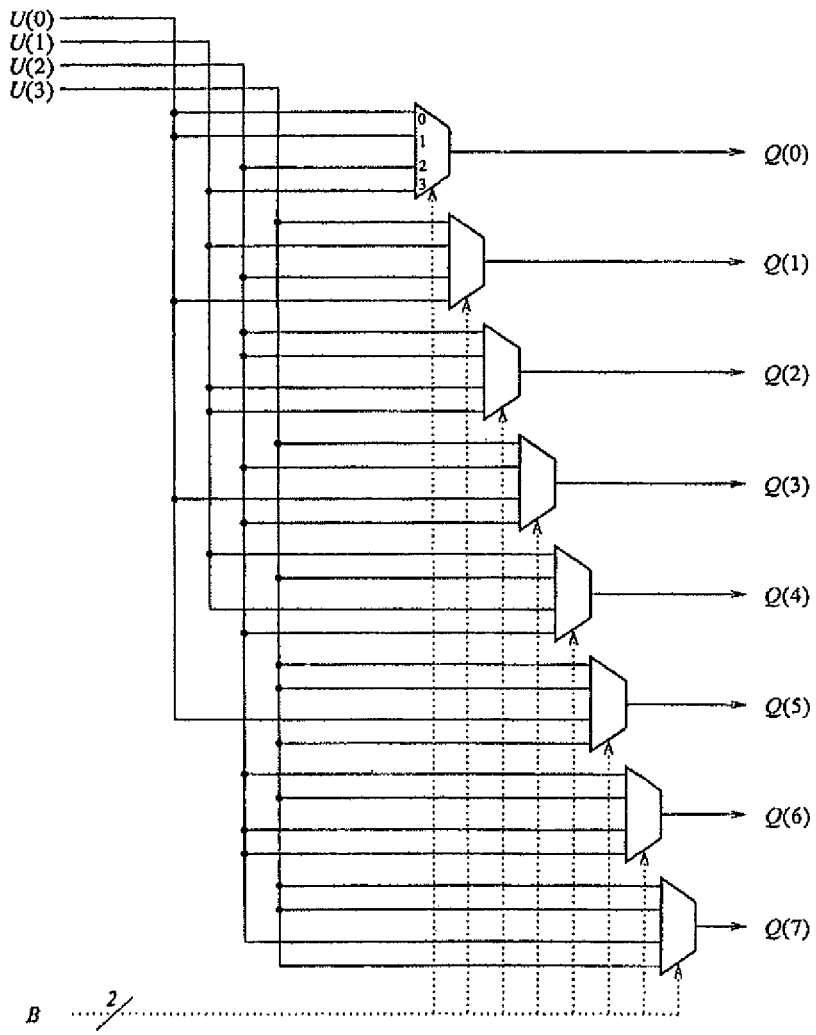
Figure 15: A fixed mapping unit $MU(4, 2, 8, 1)$ that produces all sets of subsets of Table 2.

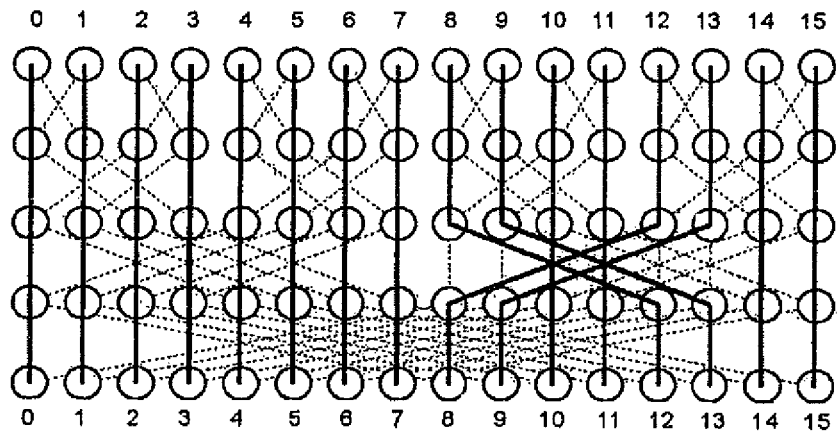
Figure 16: An example showing a permutation on the butterfly.
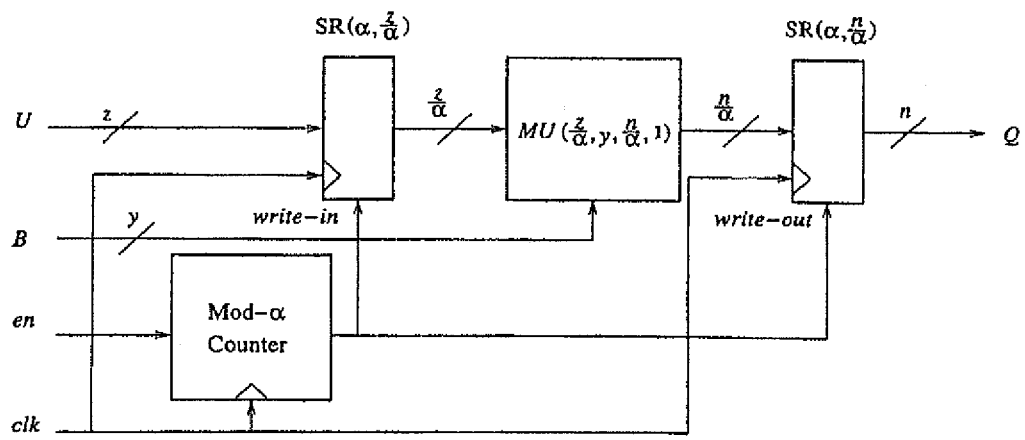
Figure 17: An implementation of a bit-slice mapping unit $MU(z, y, n, \alpha)$.

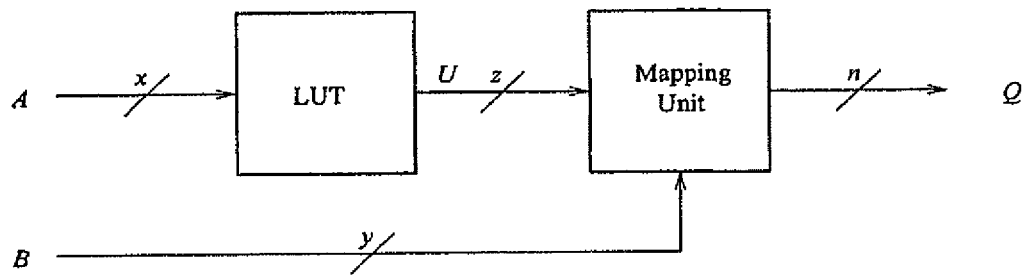
Figure 18: Structure of a mapping-unit-based configurable decoder $MUB(x, z, y, n, \alpha)$.
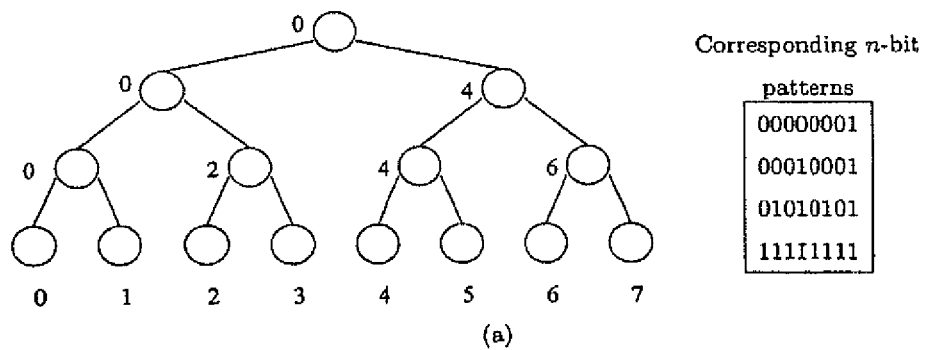
(a)
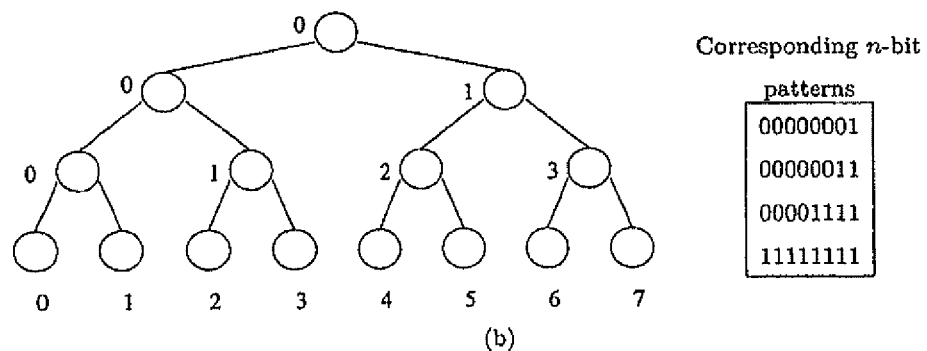
(b)
Figure 19: Two binary tree reductions of $n = 8$ elements

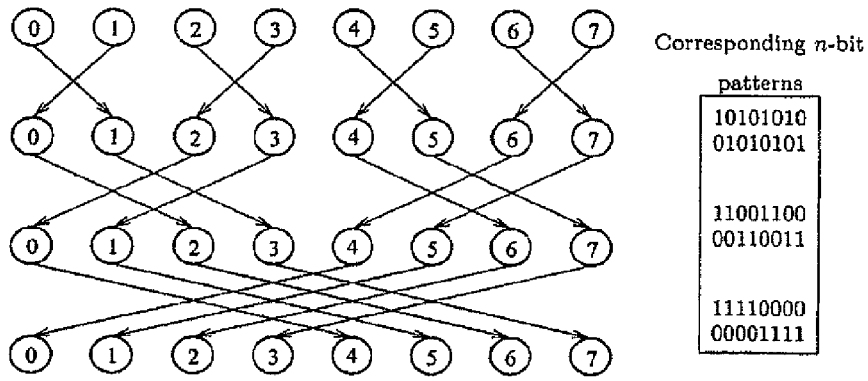
Figure 20: ASCEND/DESCEND communication pairs for $n = 8$
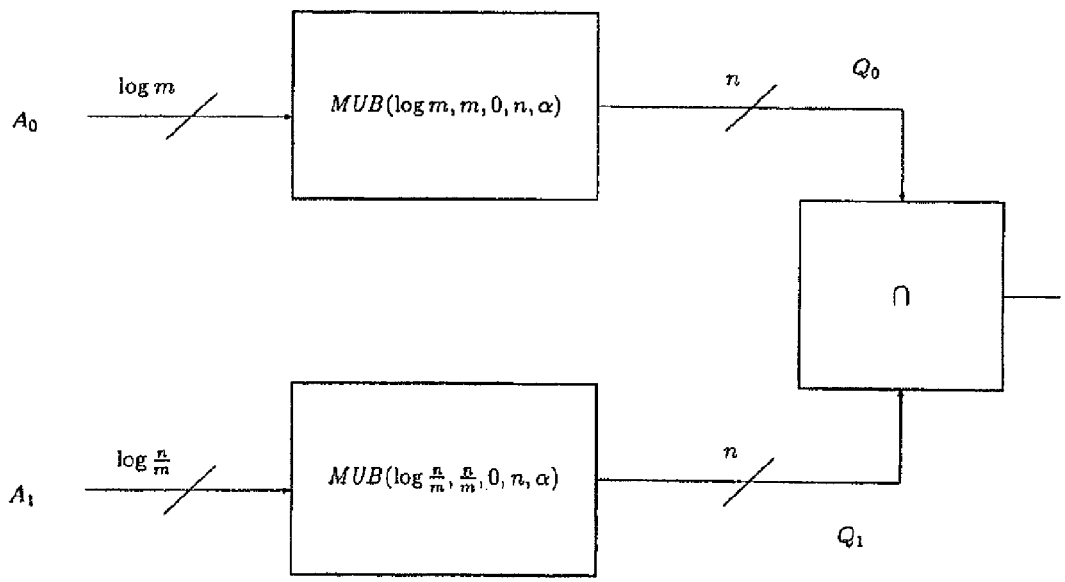
Figure 21: A parallel MU-B decoder that generates the one-hot subsets of $Z_n$

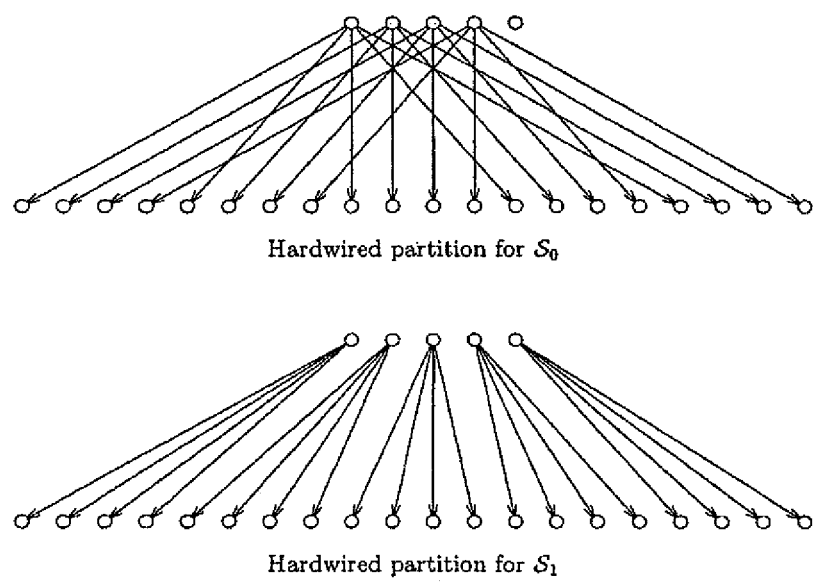
Figure 22: Hardwired partitions in the parallel MU-B decoder generating the 1-hot subset of $Z_n$

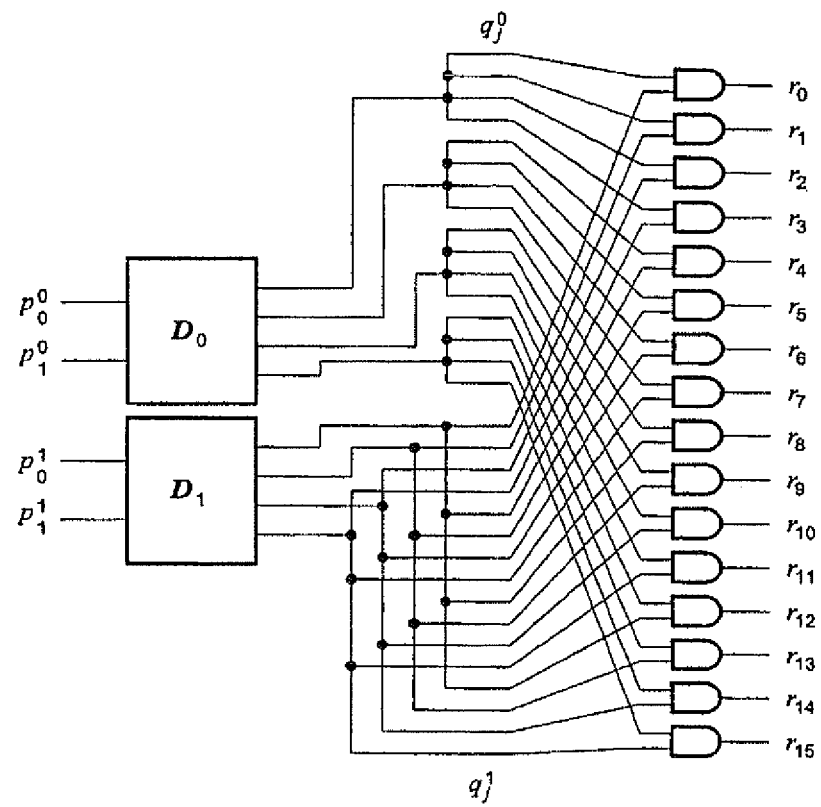
Figure 23: A parallel $O(n)$-cost one-hot 4-to-16 decoder; here $n = 16$.

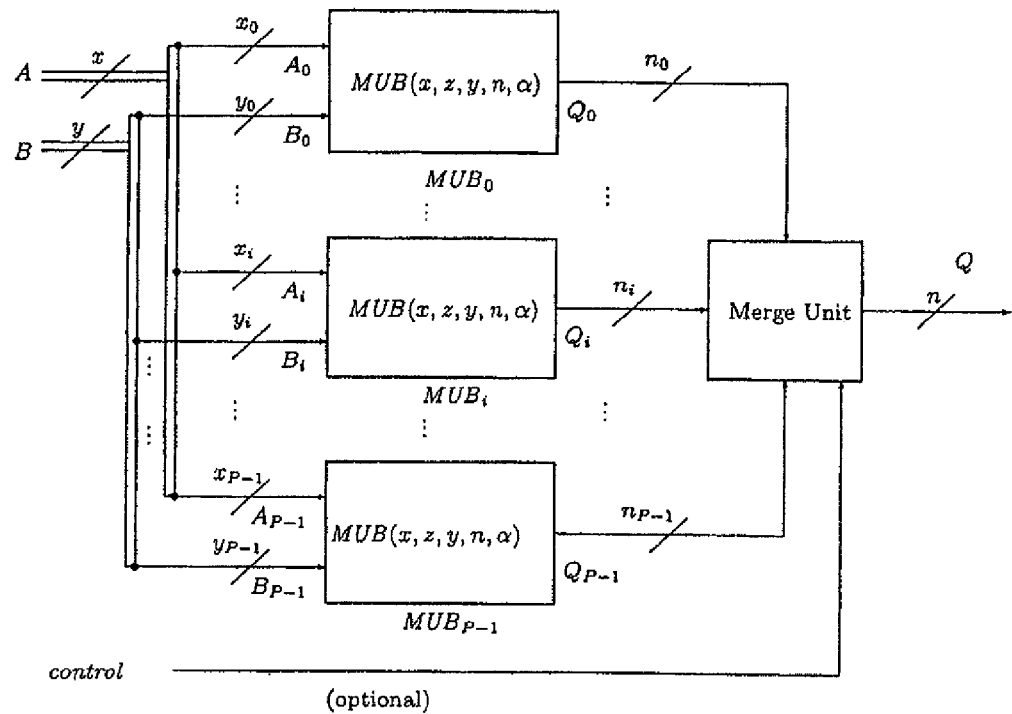
Figure 24: A parallel MU-B decoder $MUB(x, z, y, n, \alpha, P)$.
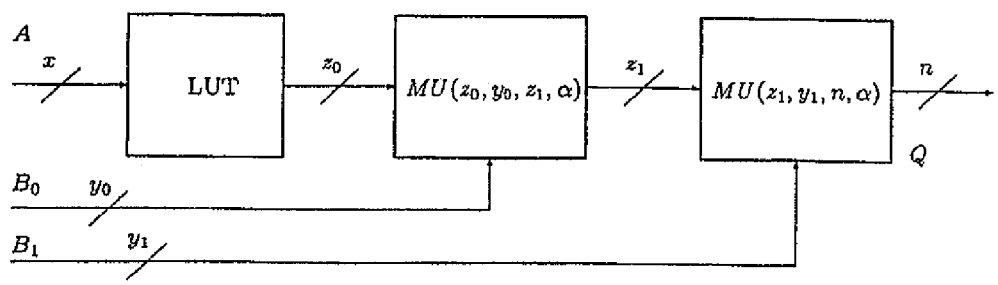
Figure 25: A serial MU-B decoder variant

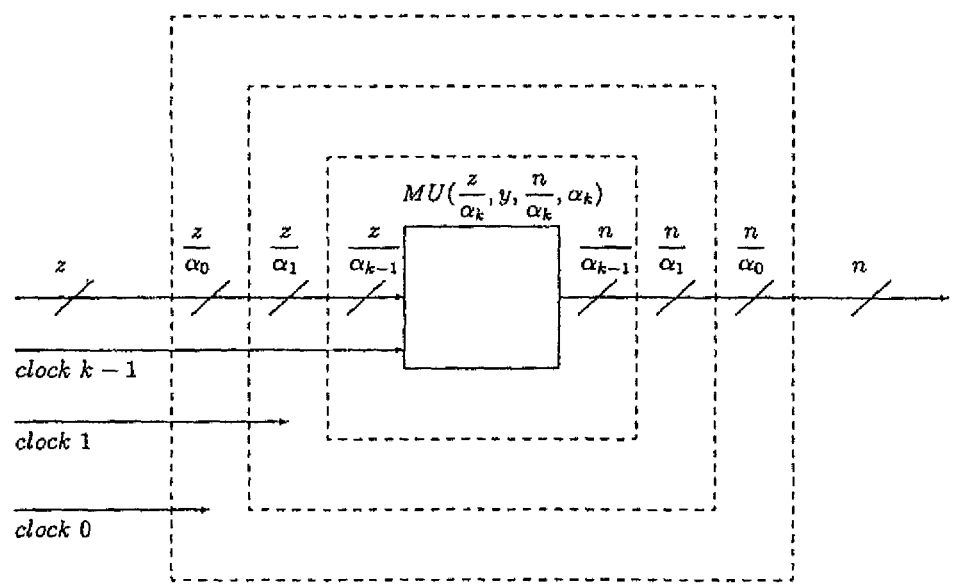
Figure 26: A conceptual view of a recursive bit-slice mapping unit. Note that $\alpha_i = \alpha_0 \alpha_1 \ldots \alpha_{i-1}$.

CONFIGURABLE DECODER WITH APPLICATIONS IN FPGAS

CROSS-REFERENCE TO RELATED APPLICATIONS

The present application is a division of U.S. patent application Ser. No. 12/310,217, entitled "A Configurable Decoder with Applications in FPGAs", filed Mar. 17, 2010, which is a 35 U.S.C. §371 application of International Patent Application No. PCT/US07/18406, filed Aug. 20, 2007, which claims the benefit of U.S. Provisional Application No. 60/838,651, filed Aug. 18, 2006. The contents of each of the foregoing applications are incorporated herein by reference hereto.

STATEMENT OF GOVERNMENT-SPONSORED RESEARCH

This invention was made with government support under grant number CCR-0310916 awarded by the National Science Foundation. The government has certain rights in the invention.

FIELD

This invention relates to decoders. Specifically, it relates to mapping units and configurable decoders based upon mapping units, where each device outputs more bits than are input to it.

BACKGROUND

Over time, processor speeds have increased faster than the rate at which information can enter and exit a chip. In many cases, it was found that increasing processor speed while ignoring the effects of input/output (I/O) produced little improvement—essentially, if information cannot get into or out of the chip at a fast enough rate, then increasing CPU speed diminishes in importance.

Data transfer to and from a chip can be improved by increasing the bit rate and/or the number of I/O pins. Since pins cannot be miniaturized to the same extent as transistors (pins must be physically strong enough to withstand contact), the rate at which the number of transistors on a chip has increased far outpaces the rate at which the number of pins on a chip has increased. For example, in Intel microprocessors, the number of transistors has increased by a factor of 20,000 in the last 30 years, whereas the number of pins in these chips increased merely by a factor of 30. Hence, the rate at which a chip can generate and process information is much larger than the available conduit to convey this information. The restriction imposed by the unavailability of a sufficient number of pins in a chip is called "pin limitation."

An example of the magnitude of the problem is presented by reconfigurable architectures, in particular, integrated circuit chips such as Field Programmable Gate Arrays (FPGAs). An FPGA is an array of programmable logic elements, all of which must be configured to suit the application at hand. A typical FPGA structure consists of a two-dimensional array of configurable logic elements connected by a configurable interconnection network, such as shown in FIG. 1. FIG. 1 shows a networked structure, where the configurable logic blocks (CLBs) are the configurable functional elements, and the switches "S" are the configurable elements in the interconnection network. Each CLB in an FPGA is sometimes subdivided into smaller configurable logic elements. For example, the Xilinx Virtex-5 FPGA's CLBs each contain two elements known as slices. At the deepest level, the most basic functional element in an FPGA usually consists of some combination of one or more Look-Up Tables (LUTs), combinational logic gates, flip-flops, and other basic logic elements. In the Virtex-5 FPGA, each slice contains four 64×1 LUTs, four flip-flops, an arithmetic and carry chain, and several multiplexers used to combine the outputs of the LUTs. Often the CLBs in an FPGA are also interspersed with other functional units, such as small memory blocks, other adder chains, and multipliers. Thus, a CLB can contain many configurable switches. Notwithstanding variations in FPGA terminology, we will use the term "CLB" to denote the basic unit represented in FIG. 2.

The FPGA's interconnection network is typically a two-dimensional mesh of configurable switches. As in a CLB, each switch S represents a large bank of configurable elements. The state of all switches and elements within all CLBs is referred to as a "configuration" of the FPGA. Because there is a large number of configurable elements in an FPGA (LUTs, flip-flops, switches, etc.), a single configuration requires a large amount of information. For example, the Xilinx Virtex-5 FPGA with a 240×108 array of CLBs requires in the order of 79 million bits for a single full configuration.

The FPGA's CLBs are fine-grained functional elements that are incapable of executing instructions or generating configuration bits internally. Thus, configuration information must come from outside the chip. A limited amount of configuration information can be stored in the chip as "contexts;" however, given the limited amount of memory available on an FPGA for such a purpose, an application may require more contexts than can be stored on the FPGA. Hence, in most cases, configuration information must still come from outside the chip, and the pin limited input can have severe consequences for the time needed for reconfiguration.

A number of applications benefit from a technique called dynamic reconfiguration, in which elements of the FPGA chip are reconfigured to alter their interconnections and functionality while the application is executing on the FPCA. Dynamic reconfiguration has two main benefits. First, a dynamically reconfigurable architecture can reconfigure between various stages of an application to use its resources efficiently at each stage. That is, it reuses hardware resources more efficiently across different parts of an algorithm. For example, an algorithm using two multipliers in Stage 1 and eight adders in Stage 2 can run on dynamically reconfigurable hardware that configures as two multipliers for Stage 1 and as eight adders for Stage 2. Consequently, this algorithm will run on hardware that has two multipliers or eight adders, as opposed to a non-configurable architecture that would need two multipliers and eight adders.

The second benefit of dynamic reconfiguration is a fine tuning of the architecture to exploit characteristics of a given instance of the problem. For example in matching a sequence to a given pattern, the internal "comparator" structure can be fine-tuned to the pattern. Further, this tuning to a problem instance can also produce faster solutions.

Dynamic reconfiguration requires a fast reconfiguration scheme. Because of this, partial reconfiguration is normally performed where only a portion of the FPGA is reconfigured. Partial configuration involves selecting the portion of the FPGA requiring reconfiguration (the addresses) and inputting the necessary configuration bits. Due to pin limitation, only a very coarse selection of addresses is available in a given time increment, resulting in a still substantially large number of FPGA elements being selected for reconfiguration. This implies that elements that do not need to be reconfigured must be "configured" anyway along with those that actually require reconfiguration.

In partial reconfiguration, the information entering the chip can be classified into two categories: (a) selection and (b) configuration. The selection information contains the addresses of the elements that require reconfiguration, while the configuration information contains the necessary bits to set the state of the targeted elements.

In order to facilitate partial reconfiguration, FPGAs are typically divided into sets of frames, where a frame is the smallest addressable unit for reconfiguration. In current FPGAs, a frame is typically one or more columns of CLBs. Currently, partial reconfiguration can only address and configure a single frame at a time, as a 1-hot decoder is usually employed. If we assume that each CLB receives the same number of configuration bits, say $\alpha$, and the number of CLBs in each frame is the same, say C, then the number of configuration bits needed for each frame is $C\alpha$. If the number of bits needed for selecting a single frame is b, then the total number of bits B needed to reconfigure a frame is:

$$B = b + C\alpha$$

Since the granularity of reconfiguration is at the frame level, every CLB in a frame would be reconfigured, regardless of whether or not the application required them to be reconfigured. This can result in a "poorly-focused" selection of elements for reconfiguration, as more elements than necessary are reconfigured in each iteration. This implies that a large number of bits and a large time overhead are spent on the reconfiguration of each individual frame. If the granularity of selection is made finer, i.e., if fewer CLBs are in each frame, then the number of selection bits needed to address the frames increases by a small amount while the number of configuration bits for each frame decreases. However since a 1-hot decoder can select only one frame per iteration, this also increases (on an average) the total number of iterations necessary to reconfigure the same amount of area in the FPGA. Pin limitation thus creates a severe restriction on the extent to which an FPGA can be dynamically reconfigured.

1.1 Notation

Before we proceed further, we introduce some notation.

In general, we use the term "word" to mean a set of bits. Different words may have different numbers of bits. We also use the terms "string" and "signal" synonymously with "word."

The $O(\cdot)$ notation indicates an upper bound on the "order of" and is used to describe how the size of the input data affects resources (time, cost etc.) in an algorithm or hardware. Specifically, for two functions $f(n)$ and $g(n)$ of a variable n, we say that $f(n) = O(g(n))$ if and only if, there is positive constant $c > 0$ and an integer constant $n_0$, such that for all $n \geq n_0$, we have $f(n) \leq cg(n)$. The relationship $f(n) = O(g(n))$ signifies that the "order of" (or asymptotic complexity of) $f(n)$ is at most that of $g(n)$ or that $f(n)$ increases at most as fast as $g(n)$. If $O(\ldots)$ denotes a lower bound on the complexity, then $\Omega(\cdot)$ and $\theta(\cdot)$ indicates an upper bound on, and the exact complexity, respectively. Specifically, $f(n) = \Omega(g(n))$ if and only if $g(n) = O(f(n))$. We say $f(n) = \theta(g(n))$ if and only if $f(n) = O(g(n))$ and $f(n) = \Omega(g(n))$.

Parts of the invention will be described in terms of "ordered partitions." A partition of set A is a division of the elements of the set into disjoint non-empty subsets (or blocks). A partition $\pi$ with k blocks is called a k-partition. For example, a 3-partition of the set $\{8,7,6,5,4,3,2,1,0\}$ is $\{\{7,6,5,4\},\{3,2\},\{1,0\}\}$. Partitions have no imposed order. An ordered k-partition is a k-partition $\{S_0, S_1, \ldots, S_{k-1}\}$ with an order (from 0 to k-1) imposed on the blocks. An ordered partition will be denoted $\langle$ ordered list of blocks $\rangle$. For instance, a 2-partition $\{S_0, S_1\}$ may be ordered as $\langle S_0, S_1 \rangle$ or and $\langle S_1, S_0 \rangle$ and $\langle S_0 \rangle \neq \langle S_0 \rangle$.

A useful operation on partitions is the product of two partitions. Let $\pi_1$ and $\pi_2$ be two (unordered) partitions (not necessarily of the same size). Let $\pi_1 = \{S_1, S_0, \ldots, S_k\}$ and $\pi_2 = \{P_0, P_1, \ldots, P_l\}$ then their product $\pi_1 \pi_2$ is a partition $\{Q_0, Q_1, \ldots, Q_m\}$ such that for any block $Q_h \in \pi_1 \pi_2$, elements a, $b \in Q_h$ if and only if there are blocks $S_i \in \pi_1$ and $P_j \in \pi_2$, such that $a, b \in S_i \cap P_j$. That is, two elements are in the same block of $\pi_1 \pi_2$ if and only if they are in one block of $\pi_1$ and in one block of $\pi_2$. For instance, consider the partitions $\pi_1 = \{\{7,6,5,4\},\{3,2\},\{1,0\}\}$ and $\pi_2 = \{\{7,6\},\{5,4,3,2\},\{1,0\}\}$. Then $\pi_1 \pi_2 = \{\{7,6\},\{5,4\},\{3,2\},\{1,0\}\} = \pi_2 \pi_1$.

For any digital circuit, including those considered in this invention, an n-bit output can be viewed as a subset of an n-element set. Let $Z_n = \{0, 1, \ldots, n-1\}$. Consider an n-bit signal $A = A(n-1)A(n-2) \ldots A(0)$ (where $A(i)$ is the $i^{th}$ bit of A; in general, we will consider bit 0 to be the least significant bit or the lsb). If A is an n-bit output signal (or word) of a digital circuit, then it can be viewed as the subset $i \in Z_n$: $A(i) = 1$ of $Z_n$. The n-bit string A is called the characteristic string of the above subset. The set $\{i \in Z_n : A(i) = 1\}$ is said to be characterized by A and is sometimes referred to as the characteristic set. For example if n=8, then output A=00001101 corresponds to the subset $\{0,2,3\}$. Outputs 00000000 and 11111111 correspond to the empty set, $\emptyset$ and $Z_n$, respectively. (It should be noted that the convention could be changed to exchange the meanings of 0's and 1's. That is, a 0 (resp., 1) in the characteristic string represents the inclusion (resp., exclusion) of an element of $Z_n$ in the set. All ideas presented in this document apply also to this "active-low" convention.) Throughout this document, we assume (unless mentioned otherwise) that the base of all logarithms is 2. Consequently, we will write log n to indicate $\log_2 n$. We will also use the notation $\log^a n$ to denote $(\log n)^a$.

1.2 Prior Art

Prior art methods to address the pin limitation problem include: (1) multiplexing, (2) storing information within the design, and (3) decoding. Multiplexing refers to combining a large number of channels into a single channel. This can be accomplished in a variety of ways depending on the technology. Each method assumes the availability of a very high speed, high bandwidth channel on which the multiplexing is performed. For example, in the optical domain, wavelength division multiplexing allows multiple signals of different wavelengths to travel simultaneously in a single waveguide. Time division multiplexing requires the multiplexed signal to be much faster than the signals multiplexed. Used blindly, this is largely useless in the FPGA setting, as it amounts to setting an unreasonably high clocking rate for parts of the FPGA.

Storing information within the design attempts to alleviate the pin limitation problem by generating most information needed for execution of an application inside the chip itself (as opposed to importing it from outside the chip). This requires a more "intelligent" chip. In an FPGA setting it boils down to an array of coarse grained processing elements rather than simple functional blocks (CLBs). One example is the use of virtual wires in which each physical wire corresponding to an I/O pin is multiplexed among multiple logical wires. The logical wires are then pipelined at the maximum clocking frequency of the FPGA, in order to utilize the I/O pin as often as possible. Another example of such a solution is the Self-Reconfigurable Gate Array. This latter approach is a significant departure from current FPGA architectures. Yet another approach is to compress the configuration information, thereby reducing the number of bits sent into the chip.

Decoders are the third means used to address the pin limitation problem. A decoder is typically a combinational circuit that takes in as input a relatively small number of bits, say x bits, and outputs a larger number of bits, say n bits, according to some mapping; such a decoder is called an "x-to-n decoder." If the x inputs are pins to the chip and the is n outputs are expanded within the chip, a decoder provides the means to deliver a large number of bits to the interior of the chip. An x-to-n decoder (that has x input bits) can clearly produce no more than $2^x$ output sequences, and some prior knowledge must be incorporated in the decoder to produce a useful expansion to n output bits. Decoders have also been used before with FPGAs. Our invention when used in the context of FPGAs has more application in selecting parts of the chip in a more focused way than conventional decoders do. However in a broader context, the method we propose is a general decoder for any scheme employing fixed size code words, that decode into (larger) fixed size target words.

As we noted earlier, for any digital circuit, including a decoder, an n-bit output can be viewed as a subset of the n-element set $Z_n = \{0, 1, \ldots, n-1\}$. Thus, the set of outputs produced by an x-to-n decoder can be represented as a set of (at most $2^x$) subsets of $Z_n$.

An illustration of 3-to-8 decoders (with 3 input bits and 8 output bits) is shown in Table 1.

Sets $S_o$, $S_1$, $S_2$ and $S_3$ represent different decoders, each producing subsets of $Z_n$. For instance, $S_0$ corresponds to the set of subsets $\{\{0\},\{1\},\{2\},\ldots 7\}\}$. This represents the 3-to-8 one-hot decoder.

Current decoders in FPGAs are fixed decoders, producing a fixed set of subsets (output bit combinations) over all possible inputs. The fixed decoder that is normally employed in most applications is the one-hot decoder that accepts a

TABLE 1

Example of 3-to-8 Decoders

| Decoder Inputs | $S_0$ | $S_1$ | $S_2$ | $S_3$ |
|---|---|---|---|---|
| 000 | 00000001 | 01010101 | 11111111 | 00001101 |
| 001 | 00000010 | 10101010 | 00011111 | 10010010 |
| 010 | 00000100 | 00110011 | 00000011 | 10100010 |
| 011 | 00001000 | 11001100 | 00000001 | 00111101 |
| 100 | 00010000 | 00001111 | 11110000 | 01001110 |
| 101 | 00100000 | 11110000 | 11000000 | 11010001 |
| 110 | 01000000 | 11111111 | 10000000 | 11100001 |
| 111 | 10000000 | 00000000 | 00111100 | 01111110 |

$(\log_2 n)$-bit input and generates a 1-element subset of $Z_n$ (see set $S_o$ in Table 1). (In subsequent discussion all logarithms will be assumed to be to base 2, that is, $\log n = \log_2 n$). In fact, the term "decoder" is usually taken to mean the one-hot decoder.

A one-hot decoder causes severe problems if, in an array of n elements, some arbitrary pattern of those elements is needed for reconfiguration. Here, selecting an appropriate subset can take up to $\theta(n)$ iterations. Notwithstanding this inflexibility, one-hot decoders are simple combinational circuits with a low $O(n \log n)$ gate cost (typically given as the number of gates) and a low $O(\log n)$ propagation delay. The one-hot decoder will usually take multiple cycles or iterations to set all desired elements to the desired configuration. Thus, reconfiguration is a time consuming task in current FPGAs and consequently, they fail to fully exploit the power of dynamic reconfiguration demonstrated on theoretical models.

Look-up tables (LUTs) can function as a "configurable decoder." A $2^x \times n$ LUT is simply a $(2^x)$-entry table, where each entry has n bits. It can produce $2^x$ independently chosen n-bit patterns that can be selected by an x-bit address. LUTs are highly flexible as the n-bit patterns chosen for the LUT need no relationship to each other. Unfortunately, this "LUT decoder" is also costly; the gate cost of such a LUT is $O(n2^x)$. For a gate cost of $O(n \log n)$, a LUT decoder can only produce $O(\log n)$ subsets or mappings. To produce the same number of subsets as a one-hot decoder, the LUT decoder has $O(n^2)$ gate cost. Clearly, this does not scale well.

What is needed is a configurable decoder that is an intermediary to the high flexibility, high cost LUT decoder and the low flexibility, low cost fixed decoder.

2 SUMMARY OF THE INVENTION

It is an object of the invention to allow the multicasting of x bits into n bits through hardwired circuitry where the hardwired route is selected by an input selection word.

It is an object of the invention to provide a device that can be incorporated into an FPGA device (or any other chip operating in a pin-limited environment) to allow for the expansion of x bits input, to the FPGA device over x pins, to be expanded into n bits (where n>x) internally in the FPGA to allow for an increase in the selection reconfiguration information to reconfigure the FPGA device.

It is an object of the invention to allow the multicasting of x bits into n bits, $\alpha$ bits at a time, through hardwired circuitry, where the hardwired route is selected by an input selection word from a reconfigurable memory device.

It is an object of the invention to provide a reconfigurable mapping unit in conjunction with a second reconfigurable memory unit, where the second memory unit allows for selection of the z bits to be input into the reconfigurable mapping unit from x bits, where x>z.

Accordingly, the invention includes a reconfigurable mapping unit that is a circuit, possibly in combination with a reconfigurable memory device. The circuit has as input an x-bit word having a value at each bit position, and a selector bit word, input to the circuit. The circuit outputs an n-bit word, where n>x, where the value of each bit position of the n-bit output word is based upon the value of a pre-selected hardwired one of the bit positions in the x-bit word, where said hardwired pre-selected bit positions is selected by the value of the selector bit word. The invention may include a second reconfigurable memory device that outputs the z-bit word, based upon an input x-bit word to the second memory device, where x<z. The invention may produce the output n bit, $\alpha$ bits at a time.

3 BRIEF DESCRIPTION OF THE FIGURES

FIG. 1 shows the structure of a typical field-programmable gate array (FPGA).

FIG. 2 shows a block diagram of the Xilinx Virtex 5 configurable logic block.

FIG. 3 shows a block diagram for the function of a fan-in of degree $f$ and width w.

FIG. 4 shows a block diagram for the function of a fan-out of degree $f$ and width w.

FIG. 5 illustrates the typical implementation of a one-hot decoder though a 4-to-16 one-hot decoder.

FIG. 6 illustrates the typical implementation of a multiplexer through a 4-to-1 multiplexer.

FIG. 7 shows the block diagram of a $2^z \times m$ LUT.

FIG. 8 shows an implementation of a $2^z \times m$ LUT.

FIG. 9 shows the structure of the shift register $$SR\left(Z, \frac{x}{\alpha}\right).$$

FIG. 10 shows one way to implement a shift register $$\left(Z, \frac{x}{\alpha}\right)$$

that can be used as a serial-to-parallel and parallel-to-serial converter.

FIG. 11 shows a block diagram of a mapping unit MU(z, y,n,α).

FIG. 12 shows an example with two different multicasts of 4 bits to 8 bits. Each multicast is further illustrated with different values for the 4-bit source word.

FIG. 13 shows the general structure of a mapping unit MU(z,y,n,α).

FIG. 14 shows a fixed mapping unit MU(4,1,8,1) that produces the set of subsets $S_0$ and $S_1$ of Table 2.

FIG. 15 shows a fixed mapping unit MU(4,2,8,1) that produces all three sets of subsets of Table 2.

FIG. 16 shows the butterfly network, configured to illustrate the example permutation used in the discussion of post-permutation in mapping units.

FIG. 17 shows an implementation of a bit-slice mapping unit MU (z,y,n,α).

FIG. 18 shows the structure of a mapping-unit-based configurable decoder MUB(x,z,y,n,α).

FIG. 19 illustrates two binary tree reductions of n=8 elements. For each of these reductions the corresponding bit patters (subsets) are also shown.

FIG. 20 shows the communicating pairs in an ASCEND/DESCEND pattern for n=8. The corresponding bit patters (subsets) for each level of communication is also shown.

FIG. 21 shows a parallel MU-B decoder that generates the one-hot subsets of $Z_n$.

FIG. 22 shows the hardwired partitions used in the two parallel MU-B decoders in an optimal configuration generating the 1-hot subset of Z.

FIG. 23 shows a parallel $O_n$-cost one-hot 4-to-16 fixed decoder; here n=16.

FIG. 24 shows a general structure of a parallel MU-B decoder MUB(x,y,n,α,P).

FIG. 25 shows a serial MU-B decoder variant.

FIG. 26 shows a conceptual view of a recursive bit-slice mapping unit. In the figure $\alpha_i = \alpha_0 \alpha_1 \ldots \alpha_{i-1}$.

4 DETAILED DESCRIPTION OF THE INVENTION

The invention includes a mapping unit, and a configurable decoder that incorporates a mapping unit. The mapping unit may be an integral or bit-slice mapping unit. The invention includes configurable decoder variants and methods to construct the partitions required to configure a mapping unit. We will compare the invention to existing circuits, where the comparison is in terms of performance parameters (such as circuit delays and circuit costs, as measured by the number of overall gates in a design). All parameters are expressed in terms of their asymptotic complexity to avoid minor variations due to technology and other implementation-specific details.

We assume that each instance of a gate has constant fan-in, constant fan-out, unit cost and unit delay; the fan-in and fan-out are each assumed to be at least 2 and here constant means independent of problem size. While the cost and delay of some logic gates (such as XOR) is certainly larger than the size and delay of smaller logic gates (such as NAND in some technologies), the overall number of gates in the circuit and the depth of the circuit provide a better measure of the circuit's costs and delays, rather than factors arising from choices specific to a technology and implementation. We divide the performance parameters into two categories: independent parameters and problem dependent parameters. Independent parameters are applicable to all circuits, while problem dependent parameters are specific to decoders. The calculated performance parameters are delay and gate cost. The delay or time cost of a combinational circuit is the length of the longest path from any input of the circuit to any output. The gate cost (or simply cost) of a circuit is the number of gates (AND, OR, NOT) in it. Clearly, the use of other gates such as NAND, XOR, etc. will not alter the gate cost expressed in asymptotic notation.

Here a decoder is a combinational circuit (with the exception of the bit-slice units later described), that, in order to achieve a greater degree of flexibility, can be combined with lookup tables (LUTs), to create a configurable mapping unit or a configurable decoder. While LUTs could be implemented using sequential elements, for this work, LUTs are functionally equivalent to combinational memory such as ROMs. Any type of memory could be used for a LUT.

Recall that any x-to-n decoder (including the mapping unit) takes x bits as input and outputs n bits; and the set of subsets generated by the configurable mapping unit decoder are those tailored in part for the application at hand. Different applications require different sets of subsets of $Z_n$, and do so with different constraints on speed and cost. The reconfigurable mapping unit and configurable decoder have a portion of the hardware that can be configured (off-line) to modify the output bit pattern. This allows one to freely select a portion of the subsets produced by the mapping unit or reconfigurable decoder. Hence, given an understanding of the problem to be addressed, the mapping unit and/or configurable decoder may be configured to address the specific problem.

Recall that an x-to-n decoder produces a set S of subsets of $Z_n$. We denote the number of elements in S by Λ, that denotes the total number of subsets produced by the decoder. Clearly, $\Lambda \leq 2^x$. The decoder allows some of the Λ subsets to be chosen arbitrarily (the independent-subsets) while other subsets are set by prior choices (the dependent subsets). Let $S \subseteq S'$ denote the portion of subsets that can be produced independently by the decoder. For instance, in a LUT decoder, all entries are independent, while in a fixed decoder (non-configurable) there are no independent subsets. We define the following two parameters that are specific to decoders. Number of independent subsets=λ=number of elements in S Total number of subsets=Λ; clearly $\lambda \leq \Lambda \leq 2^x$.

Basic circuit hardware is used as building blocks, in particular fan-in and fan-out circuits, one-hot decoders, multiplexers, look-up tables (LUTs), shift registers, and modulo-α counters. A brief explanation of each follows:

Fan-in and Fan-Out:

A fan-in operation combines $f$ signals into a single output, while a fan-out takes a single input signal and generates $f$ output signals. The fan-in and fan-out operations are as follows:

For integers $f$, z>1, let $U_0, U_1, \ldots, U_{f-1}$ be $f$ signals, each z bits wide. A fan-in operation of degree $f$ and width z produces a z-bit output W whose $i^{th}$ bit $W(i)=U_0(i) \circ U_1(i) \circ \ldots \circ U_{f-1}(i)$. The operator $\circ$ is an associative Boolean operation, such as AND, OR, NOR, etc. Diagrammatically, FIG. 3 shows a fan-in operation.

For integers $f$, $z>1$, let U be a z-bit wide signal. A fan-out circuit of degree $f$ and width z produces $f$ outputs $W_0$, $W_1, \ldots, W_{f-1}$, each z bits wide, where $W_j(i)=U(i)$. Diagrammatically, FIG. 4 shows a fan-out operation.

Fan-in and fan-out circuits of degree $f$ and width z can be constructed with a gate cost of $O(f\,z)$ and a delay of $O(\log f)$.

As we noted earlier, all gates are assumed to have a constant fan-in and fan-out of at least 2; that is, the maximum number of inputs to a gate and the maximum number of other gates driven by the output of a given gate are independent of the problem size. When the fan-out of a signal in a circuit exceeds the driving capacity of a gate, buffers are inserted into the design. These additional buffers increase the cost and delay of the circuit. Gates typically have a fixed number of inputs. Realizing gates with additional inputs boils down to constructing a tree of gates. Assuming a non-constant fan-in and fan-out ignores the additional gate cost and delay imposed by these elements; Assuming some constant fan-in and fan-out (rather than a particular technology dependent constant) will not change the asymptotic costs and delays.

Fixed Decoders—One-Hot Decoders:

A x-to-n decoder is a (usually combinational) circuit that takes x bits of input and produces n bits of output, where x<n. Usually x<<n, and a decoder is used to expand an input from a small ($2^x$)-element domain to an output from a large ($2^n$)-element set.

Decoders can be divided into two broad classifications: (a) fixed decoders, which are inflexible, and (b) configurable decoders, where the set of subsets produced can be changed (or reconfigured) in some manner (typically off-line). One typical fixed decoder is the one-hot decoder.

In a one-hot decoder that operates on an input bit pattern of log n bits and producing an output bit pattern of n bits, each of the n-bit output patterns has only one active bit (usually with a value of '1'), all other bits being inactive (usually '0'). Such a decoder is exemplified by set $S_0$ in Table 1. This decoder, in effect, selects one element at a time. Usually, a one-hot decoder also has a select input that allows the output set to be null. The one-hot decoder is used so often that the term "decoder" in the context of combinational circuits is usually taken to mean a one-hot decoder. A typical implementation of one-hot decoder is shown for a 4-to-16, one-hot decoder in FIG. 5.

In general, an x-to-$2^x$ one-hot decoder has a delay of $O(x)$ and a gate cost of $O(x2^x)$.

Multiplexers:

A multiplexer or MUX is a combinational circuit that selects data from one of many inputs and directs it to a single output line. In general, a $2^x$-to-1 multiplexer (or a ($2^x$)-input multiplexer) takes $2^x$ data inputs and using x control bits, selects one of the $2^x$ inputs as the output.

An example of a typical implementation of a multiplexer with four inputs is shown in FIG. 6. In this figure, each of the four data inputs, $U_0$, $U_1$, $U_2$ and $U_3$ is selected via an AND gate and a combination of the two control bits $V_0$ and $V_1$, much like the one-hot decoder.

A $2^x$-to-1 multiplexer can be implemented as a circuit with a gate cost of $O(x2^x)$ and a delay of $O(x)$.

Look-Up Table:

A $2^x \times m$ LUT is a storage device with $m2^x$ storage cells organized as $2^x$ words, each m bits long; see FIG. 7. This LUT has as input x bits to address the $2^x$ locations and outputs an m-bit word. LUTs have a variety of other applications, such as implementing small logic functions. A $2^x \times m$ LUT can implement any m Boolean functions, each of x variables, by storing their truth tables. This use of LUTs is quite common for implementing Boolean functions in FPGAs.

While LUTs can be implemented in a variety of ways, all LUTs require the same two components: a memory array and a method of addressing a word in the memory array. One possible method of addressing the LUT is to use an x-to-$2^x$ one-hot decoder. The output of the one-hot decoder activates a wordline and enables the outputs of the memory storage cells. Each of the memory storage cell outputs are then fanned-in to form an m-bit output word. See FIG. 8. The implementation shown in this figure is independent of the choice of memory storage elements. SRAM-based LUTs are perhaps the most common implementation; however, with minimal modifications, this basic design can easily accommodate other memory cell types. LUTs composed of sequential elements are also possible, however this would require the use of a clock. This clock can be independent of any other clock in the system. Regardless of the implementation chosen, the asymptotic cost of the structure is unchanged; choices in memory technology only alter the size and access times of the LUT by a constant factor. Thus, we will consider the LUT to be a combinational element for cost analysis.

A $2^x \times m$ LUT can be implemented as a circuit with a gate cost of $O(2^x(x+m))$ and a delay of $O(x+\log m)$.

Shift Register (Parallel to Serial Converter):

Define an $\alpha$-position shift register of width $$\frac{z}{\alpha},$$

donated by $$SR(Z, \frac{z}{\alpha}),$$

as follows. It accepts as input a z-bit signal, and every clock cycle, outputs a (z/$\alpha$)-bit slice of that signal. FIG. 9 diagrams the operation. The shift register can also be configured as a parallel-to-serial converter. That is accept $$\frac{z}{\alpha}$$

bits during each cycle, and output an n-bit word every a cycles. FIG. 10 is a circuit implementation of such a shift register.

An $\alpha$-position shift register of width $$\frac{z}{\alpha}, SR(z, \frac{z}{\alpha})$$

can be realized as a circuit with a gate cost of $O(z)$ and a constant delay between clock cycles.

Modulo-$\alpha$ Counter:

For any $\alpha>1$, a modulo-$\alpha$ (or mod-$\alpha$) counter increments its output by '1' every clock cycle, returning to '0' after a count of $\alpha-1$. Modulo-$\alpha$ counters are well known in the art.

A modulo-$\alpha$ counter can be realized as a circuit with gate cost $O(\log^2 \alpha)$ and a delay of $O(\log \log \alpha)$.

4.1 The Mapping Unit

The base unit of the invention is the mapping unit, and its features are diagrammed in FIG. 11. The mapping unit MU(z, y n, α) can be viewed as a type of decoder: it takes in a small number of bits (z bits) and expands them to a larger number of bits (n bits), where typically z<<n. We will refer to the z-bit input as the source word, the y-bit input as the selector address (or the selector address word), and the n-bit output as the output word.

The mapping unit accomplishes the expansion of the z-bit source word to the n-bit output word by "multicasting" the z-bits to n places. A multicast of z bits to n bits (or z places to n places) is a one-to-many mapping from the z source bits to the n output bits, such that each output bit is mapped onto from exactly 1 source bit, but each source bit may map to 0, 1 or more output bits. The multicast operation typically transfers the value of a source bit to the output bit it is mapped to. Here we will use it in a more general sense in that the output bit derives its value from the source bit it is mapped from, for example by complementation. Unless we note otherwise, a multicast transfers the value of each source bit to its corresponding output bits. (The inclusion of parameters y and α in the mapping unit MU(z,y,n,α) will be described later).

As an example, a fixed mapping of 4 to 8 bits can be represented as a 4 to 8 multicast, and is diagrammed in FIG. 12(a)-(d), where FIG. 12(a), (b) represent one fixed multicast operation while FIGS. 12(c) and (d) represent a second fixed multicast operation.

As an illustration, consider a multicast of four bits a(3), a(2),a(1),a(0) to 8 bits b(7),b(6),b(5),b(4),b(3),b(2),b(1),b(0), such that (0)=a(0), b(1)=b(3)=b(5)=b(7)=a(3), b(2)=b(6)=a(2) and b(4)=a(1). If a=0111, then b=01010101 (FIG. 12(a)). If a=0011, then b=00010001 (FIG. 12(b)). A different 4 to 8 mapping of a to b will result in different outputs. For example, if the mapping is b(0)=a(0), b(1)=a(1), b (2)=b(3)=a(2) and b(4)=b(5)=b(6)=b(7)=a(3), then for a=0111, b=00001111 (FIG. 12(c)), while if a=0011, then b=00000011 (FIG. 12(d)). The mapping unit of the invention is broader than a unit containing one fixed multicasting operation. It uses several fixed multicasts, and the choice of the multicast operation to be employed is selected by the value of the y-bit selector address input to the mapping unit, as shown in FIG. 11. Hence, the number of possible multicasts used in a MU(z,y, n,α) is $2^y$.

Another characterization of a multicast is in terms of an ordered partition. Consider a multicast of bits a(z−1), a(n−2), ..., a(1),a(0) to bits b(n−1),b(n−2), ..., b(1),b(0). An ordered z partition $S_0, S_1, \ldots, S_{z-1}$ of $z_n$={0, 1, ..., n−1} represents this multicast if and only for all bit positions j of a particular block $S_i$, b(j) gets its value from a(i).

For example, the multicasts of FIGS. 12(a),(b) and (c),(d) correspond to the ordered 4-partitions $\vec{\pi}_1$=⟨{7,5,3,1},{4}, {0}⟩ and $\vec{\pi}_2$=⟨{7,6,5,4},{3,2},{1},{0}⟩. The ordered partition represents the mapping of the source word bits to the output word bits, where the position of the block in the partition (for instance block {7,5,3,2} is in position 4 of $\vec{\pi}_2$) represents the position of the source word bit (position 4 here), and the value of the block ({7,5,3,2} here) represents the output word bit positions to which the value of the input bit get mapped or cast into (here a(4) gets mapped to b(7),b (5),b(3) and b(2)). Hence a mapping unit can be considered a mapping of a z-bit source word to an n-bit output word, using an ordered partition selected by the selector address (y bits), or a mapping $\mu: Z_{2^z} \times Z_{2^y} \to Z_{2^n}$ In summary, MU(z,y,n,α) accepts as input a z-bit source word, U, and an ordered partition $\vec{\pi}$ (one among $2^y$) as selected by the y-bit selector address, B, of FIG. 11, and produces as output an n-bit output word (or a subset of $Z_n$). The source word could assume any value from $\{0,1\}^z$. The set of $2^y$ ordered partitions is fixed (usually hardwired in the mapping unit) and/or configured into a LUT internal to the mapping unit.

4.1.1 Different Types of Mapping Units

As described, a mapping unit is a decoder that accepts as input a z-bit source word u and an ordered z-partition $\vec{\pi}$ of an n-element set (specified in terms of a y-bit selector address). It produces an n-bit output word. Mapping units can be classified as integral or bit-slice. An integral mapping unit generates all n output bits simultaneously and (for reasons explained below) has the parameter α set to 1. A bit-slice mapping unit, on the other hand, generates the n output bits in α rounds; i.e., $$\frac{n}{\alpha}$$

bits at a time. One could view the integral mapping unit as a bit-slice mapping unit with α=1. Another way to categorize mapping units (both integral and bit-slice) is in terms of whether they are fixed or configurable (that is, based on whether they can be configured off-line to alter their behavior). Configurable mapping units can be general or universal. In informal terms, a universal mapping unit can produce any subset. Fixed mapping units cannot be universal (unless n is very small or a very high cost can be accepted).

A General Model of a Mapping Unit:

A general structure of a mapping unit, MU(z, y, n, α), is as shown in FIG. 13. The n-bit output word comes from a bank of n multiplexers (MUXs). MUX i (0≤i<n) accepts $2^{y_i}$ data bits as input and uses $y_i$ control bits. Each data input of a MUX is hardwired from one of the z source bits. This relationship between the source word and MUX inputs is fixed at the time of manufacture (even for configurable mapping units); although, in principle, some amount of configurability may be introduced in these connections. Denote the $y_i$-bit control signal of MUX i by $B_i$. The concatenated control bits ⟨$B_0$, j$B_1$, ..., $B_{n-1}$⟩ is called the selector word of the mapping unit. The selector word can be of different sizes and can be generated in a variety of ways in different types of mapping units. The mapping unit has, embedded in its structure, room for $2^y$ different selector words, each corresponding to an ordered partition (or a multicast scheme from the source word to the output word). These selector words are generated and chosen by the selector module, using a y-bit selector address. The different selector words can be stored in a "configuration LUT" and/or expressed by the value of the selector address. For the mapping unit models we discuss beyond this point, $y_i$=y. This need not be the case, however, in general. The control bits can be derived in any manner from the y selector address bits, for example, by directly hardwiring a subset of the y bits to each MUX control. At the other extreme is using a LUT for the selection module with wordsize w such that max$\{y_i: 0 \le i < n\} \le w \le \sum_{i=0}^{n-1} y_i$. Here, some or all of the w bits in each selector word can be used to control a MUX.

We now describe two main types of mapping units, fixed and configurable. Other types and variants are described later.

Fixed Mapping Unit:

In the fixed mapping unit (FMU), the y-bit selector address is broadcast as the control signal to each MUX. That is, the selector module constructs the selector word by concatenating n copies of the selector address. Therefore, $y_i$=y. As an example, let $z=4$, $y=1$, and $n=8$. Then there are $2^y=2$ ordered partitions mapping the 4 source word bits to the 8 output word bits. Let the mappings be as shown in FIGS. 12(*a*),(*b*) and (*c*),(*d*), which produce the sets of subsets $S_0$ and $S_1$ from Table 2.

TABLE 2

Example sets of subsets of $Z_8$.

| $S_j^i$ | $S_0$ | $S_1$ | $S_2$ |
|---|---|---|---|
| $S_0^i$ | 11111111 | 11111111 | 10100010 |
| $S_1^i$ | 01010101 | 00001111 | 11111101 |
| $S_2^i$ | 00010001 | 00000011 | 01011010 |
| $S_3^i$ | 00000001 | 00000001 | 00000111 |

The resulting FMU is shown in FIG. 14. Notice that if input signal B=0, then U(0) is connected to Q(0), U(1) is connected to Q(4), U(2) is connected to Q(2) and Q(6), etc. This matches the configuration shown in FIGS. 12(*a*) and (*b*). Similarly, if B=1, then U(0) is connected to Q(0), U(1) is connected to Q(1) etc. It can be shown that a fixed mapping unit can be realized as a circuit with a gate cost of $O(ny2^y)$ and a delay of $O(y+\log n)$.

Configurable Mapping Unit:

When the ordered partitions of a mapping unit are fixed (as in an FMU), it can be shown that certain subsets cannot be produced. Here, we seek to provide a means to change the ordered partitions off-line in a configurable mapping unit (or CMU).

In a CMU, the selector module is a $2^y \times ny$ LUT (called the configuration LUT). Each ny-bit LUT-line is a selector word containing n MUX control signals, each y bits long. That is, $y_i=y$. However, unlike the FMU, the values stored in the LUT are completely unconstrained.

It can be shown that a configurable mapping unit, MU (z,y,n,α), can be realized as a circuit having a gate cost of $O(ny2^y)$ and a delay of $O(y+\log n)$.

As an example of the functionality of a configurable mapping unit, consider the fixed mapping unit with $z=2^y$ of FIG. 15 which implements all four sets of subsets in Table 2. If a CMU was used to implement the same set of subsets using the same wiring of the signal U to the n-multiplexers, then Table 3 shows the contents of the configuration LUT. Note that the contents specify an ordered partition corresponding to a set of subsets, and not the subset itself. For example, when b=00, the LUT word is 00 00 00 00 00 00 00 00 corresponding to the ordered partition $\vec{\pi}_0$ for set $S_0$ (see Tables 2 and 4). Then with u=0111, we have the output word $\mu(u,\vec{\pi}_0)=01010101$. Similarly, with u=0011, we $\mu(u,\vec{\pi}_0)=00010001$. Thus, in this illustration, the selector address b=00 corresponds only to the ordered partition $\vec{\pi}^0$ for $S_0$.

TABLE 3

Configuration LUT words to produce the subsets of Table 2.

| selector address b ∈ B | ny-bit selector word in | Set i |
|---|---|---|
| 00 | 00 00 00 00 00 00 00 00 | 0 |
| 01 | 01 01 01 01 01 01 01 01 | 1 |
| 10 | 10 10 10 10 10 10 10 10 | 2 |
| 11 | 11 11 11 11 11 11 11 11 | 3 |

There are two important properties of the configurable mapping unit. The first is that from a perspective outside of the mapping unit, nothing changes between a fixed mapping unit and a configurable mapping unit; that is, to produce a desired subset $S_j^i$ the same values are needed for signals U and B in a configurable mapping unit as they are in a fixed mapping unit. The second is that each "grouping" of the y control bits (each corresponding to a particular MUX) in the ny-bit selector words has the same value in an FMU; If this value is v, then each of the n output bits is derived from the ordered partition 4. However, this does not have to be the case in a CMU. For example, a word in the LUT illustrated in Table 3 could have the value 00 01 10 11 00 01 10 11; this is a combination of values of different ordered partitions for different MUXs. For example, bits 7, 6 and 5 of the 8-bit output word would be derived from $\vec{\pi}_0, \vec{\pi}_1$, and $\vec{\pi}_2$, respectively, as 00, 01 and 10 are the binary representations of 0, 1 and 2, respectively. This would result in multicast with the ordered partition $\langle \{7,6,3,1\}, \{4,2\}, \{0\}, \{5\} \rangle$.

Not all sets of subsets can be generated by the CMU, however, as fixing the multicasts of the bits of the source word to the MUXs may preclude certain subset considerations.

4.1.2 Hardwiring and Configuring Mapping Units

The main function of the mapping unit is to convert a set of source words into a set of output words that correspond to a given set S of subsets of $Z_n$. In order to achieve this we consider two scenarios.

The mapping unit's hardwiring has already been fixed. The set of subsets that can be produced can be limited by this hardwiring between the source word and the MUX data inputs. Can a given S be produced by the mapping unit? If S can be produced, then what are the source words that produce the subsets? For a configurable mapping unit, what are the contents of the configuration LUT?

Here we are designing the entire mapping unit, including the hardwired connections. How can we factor in an expected set of subsets into the design? If no set of subsets is given, what hardwired connections provide the flexibility to produce a large number of subsets?

We address with these questions in the subsequent sections.

Constructing Partitions Given a Set of Subsets:

As we described earlier, an ordered partition is an abstract representation of a multicast from the source word to the output word. It is possible for different source words to use the same ordered partition to generate different output words (or subsets). Ideally, the $2^z$ source words and $2^y$ (ordered partition) selector words should produce $2^{x+y}$ distinct output words, each of which must be one of interest to us. This requires a careful selection of ordered partitions and source words.

Here we describe a procedure (called Procedure Part_Gen) that creates partitions (multi-casts) for a mapping unit MU(z, y,n,α). As a vehicle for explanation, we will also impose an (arbitrary) order on the partitions we generate. Later we will present a method to order the partition systematically. Procedure Part_Gen generates one of many possible sets of partitions. Subsequently, another procedure will outline how one could use Procedure Part_Gen to find a suitable set of partitions.

Let S be a set of subsets of $Z_n$ that we wish the mapping unit to generate. A given subset S of $z_n$ (i.e., a particular n-bit output word having bit positions indexed 0 to n−1) induces a 1- or 2-partition $\pi_S$, where $\pi_S$ is the 1-partition $\{Z_n\}$ if S is empty or $S=Z_n$; otherwise, $\pi_S$ is the 2-partition $\{S,Z_n-S\}$. The induced partition is not unique for a given S as $\pi_S = \pi_{Z_n-S} = \{Z_n-S,S\}$. When a subset is represented by an n-bit sequence (as described earlier), the induced partition creates two blocks, one containing the bit positions that have a 0 value, and the other block containing the bit positions having a 1 value. For instance, if the subset is represented by the bit stream 10001100, then the induced partition is the 2-partition $\{\{0,1,4,5,6\},\{2,3,\ 7\}\}$, while if the input bit stream is 11111111, then the induced partition is the 1-partition $\{\{0,1, 2, 3,4,5,6,7\}\}$. The induced partition is not an ordered partition.

Let $S=\{S_0, S_1, \ldots, S_{k-1}\}$ be a set of subsets of $Z_n$, and let each subset $S_i$ induce the partition $\pi_{S_i}$. Define the partition induced by S to be the product of the individual induced partitions, $\pi_S = \pi_{S_0} \pi_{S_1} \ldots \pi_{S_{k-1}}$. An example will illustrate these ideas. Consider the set of subsets of $S_0$, $S_1$ and $S_2$ (of $Z_8$) in Table 2, where each set of subsets has four elements, i.e. $S_i=\{S_0^i, S_1^i, S_2^i, S_3^i\}$, for $0 \le i \le 2$. The partitions induced by each element of the set of subsets is contained in Table 4 (note, there are four induced partitions for each $S_i$, corresponding to its four elements). Then,

TABLE 4

Partitions $\pi_{S_j^i}$ rest for subsets $S_j^i$ of Table 2.

| $S_j^i$ | $\pi_{S_j^0}$ | $\pi_{S_j^1}$ | $\pi_{S_j^2}$ |
|---|---|---|---|
| $S_0^i$ | $\{\{7, 6, 5, 4, 3, 2, 1, 0\}\}$ | $\{\{7, 6, 5, 4, 3, 2, 1, 0\}\}$ | $\{\{6, 4, 3, 2, 0\}, \{7, 5, 1\}\}$ |
| $S_1^i$ | $\{\{7, 5, 3, 1) \{6, 4, 2, 0\}\}$ | $\{\{7, 6, 5, 4\}, \{3, 2, 1, 0\}\}$ | $\{\{1\}, \{7, 6, 5, 4, 3, 2, 0\}\}$ |
| $S_2^i$ | $\{\{7, 6, 5, 3, 2, 1\}, \{4, 0\}\}$ | $\{\{7, 6, 5, 4, 3, 2\}, \{1, 0\}\}$ | $\{\{7, 5, 2, 0\}, \{6, 4, 3, 1\}\}$ |
| $S_3^i$ | $\{\{7, 6, 5, 4, 3, 2, 1\}, \{0\}\}$ | $\{\{7, 6, 5, 4, 3, 2, 1\} \{0\}\}$ | $\{\{7, 6, 5, 4, 3\}, \{2, 1, 0\}\}$ |

$\pi_{S_0}=\{\{7,5,3,1\},\{6,2\},\{4\},\{0\}\}$ $\pi_{S_1}=\{\{7,6,5,4\},\{3,2\},\{1\},\{0\}\}$ $\pi_{S_2}=\{\{7,5\},\{6,4,3\},\{1\},\{2,0\}\}$.

The procedure to create a set of z-partitions that generate a given set S of subsets of $Z_n$ is as follows. It assumes that the subsets of S are ordered in some manner. We indicate this by the symbol $\vec{S}$. At this stage it is not important how the subsets are ordered. We will assume that the indices of the elements of $\vec{S}$ reflect their order. This order determines the order in which the algorithm will consider each subset and does not reflect how the partitions will be ordered.

Procedure Part_Gen($\vec{S}$,z); generates partitions for $\vec{S}$, each with $\le z$ blocks.
1. For each $S_i \in S_1$ compute its induced partition $\pi_{S_i}$
2. Starting from $\pi_0$, pick the largest integer l such that $\pi_{S_0} \pi_{S_1} \ldots \pi_{S_{l-1}}$ has $\le z$ blocks. Let $\pi_0 = \pi_{S_0} \pi_{S_1} \ldots \pi_{S_{l-1}}$.
3. Starting from $\pi_l$, pick the largest integer m such that $\pi_{S_l} \pi_{l+1}$ has $\le z$ blocks. Let $\pi_1 = \pi_{S_l} \pi_{S_{l+1}} \ldots \pi_{S_{l+m-1}}$.
4. Repeat this process until all induced partitions $\pi_{S_i}$ have been included in some $\pi_j$.

The partitions $\pi_0, \pi_1, \ldots$ are the outputs of Procedure Part_Gen. The basic idea of the procedure is to "add" subsets in the prescribed order into the current partition until the partition has too many blocks. Then it starts afresh with the next partition. We will use this notion of "adding a subset" to an existing partition later in this discussion. We illustrate the procedure with the following example.

Let $S=S_0 \cup S_1 \cup S_2$ using the sets in Table 2, let $z=4$, then $\vec{S}=\{S_0^0, S_1^0, S_2^0, S_3^0, S_1^1, S_2^1, S_0^2, S_1^2, S_2^2, S_3^2\}$ (Note that $S_0^1$, and $S_3^1$ are not included as these are repeated elements). The induced partitions corresponding to each $S_j^i$ are in Table 4. Then using the Procedure Part_Gen we obtain $\pi_{S_0^0} \cdot \pi_{S_1^0} = \{\{7,5,3,1\},\{6,4,2,0\}\}$ $\pi_{S_0^0} \cdot \pi_{S_1^0} \cdot \pi_{S_2^0} = \{\{7,5,3,1,\},\{6,2\},\{4,0\}\}$ $\pi_{S_0^0} \cdot \pi_{S_1^0} \cdot \pi_{S_2^0} \cdot \pi_{S_3^0} = \{\{7,5,3,1\},\{6,2\},\{4\},\{0\}\} = \pi_0$ $\pi_{S_1^1} \cdot \pi_{S_2^1} = \{\{7,6,5,4,\},\{3,2\},\{1,0\}\} = \pi_1$ $\pi_{S_0^2} \cdot \pi_{S_1^2} = \{\{7,5\},\{1\} \cdot \{6,4,3,2,0\}\}$ $\pi_{S_0^2} \cdot \pi_{S_1^2} \cdot \pi_{S_2^2} = \{\{7,5\},\{2,0\},\{6,4,3\},\{1\}\}$ $\pi_{S_0^2} \cdot \pi_{S_1^2} \cdot \pi_{S_2^2} \cdot \pi_{S_3^2} = \{\{7,5,\},\{2,0\},\{6,4,3\},\{1\}\} = \pi_2$ As we noted earlier, Procedure Part_Gen does not produce ordered partitions. However, we order them here to illustrate a few points. Order the partitions as $\vec{\pi}_0 = \langle \{7,5,3,1\},\{6,2\},\{4\},\{0\} \rangle$, $\vec{\pi}_1 = \langle \{7,6,5,4\},\{3,2\},\{1,0\} \rangle$, $\vec{\pi}_{12} = \langle \{7,5\},\{2,0\},\{6,4,3\},\{1\} \rangle$.

The mapping unit uses these ordered partitions with values of the source words shown in Table 5 to generate each subset of S. Actually, the table illustrates the impact of two different orders on the partitions and is discussed later. For now, it suffices to observe the first set of 4 rows that apply to $\vec{\pi}_0$ that includes the subsets of $S_0$.

We now touch upon a few points about the relationship between ordered partitions, the source word and the output word (or subset). A subset can be generated in a variety of ways, as the same z-bit source word applied to different ordered partitions can result in the same value. In addition, two different source words applied to two differently ordered partitions can result in the same value.

A subset not in S can also be produced. For example, using the z-bit source word 1010 with the ordered partition $\vec{\pi}_0$ produces the output word 10111010 that corresponds to the subset $\{7,5,4,3,1\}$ which is not in S.

Subsets and their induced partitions may be repeated. For example, subsets $S_3^0$ and $S_3^1$ of the above example are equal, the above procedure ignores repeated subsets and their induced partitions in generating ordered partitions. However, partitions corresponding to classes of algorithms or specific applications may benefit from repeating subsets, that is, to include the repeats.

A partition with fewer than z blocks, such as $\pi_1$, results in "don't care" values (d) for the bits not corresponding to any block in the partition. Thus, the subset $S_1^1$ with source word d011 may be produced from the source word 0011 or 1011.

In the procedure, a different sequence of considering the induced partitions $\pi_{S_j^i}$ can produce a different set or number of ordered partitions. For example, if the induced partitions were considered in reverse order, that is, starting with $\pi_{S_3^2},$ such that the non-ordered partitions were $$\pi_0 = \pi_{S_3^2} \pi_{S_2^2} \pi_{S_1^2}$$

etc., then the resulting ordered partitions would be $\vec{\pi}_0 = \langle \{7,5\}, \{2,0\}, \{6,4,3\}, \{1\} \rangle$, $\vec{\pi}_1 = \langle \{7,6,5,4\}, \{3,2\}, \{1\}, \{0\} \rangle$, and $\vec{\pi}_2 = \langle \{7,5,3,1\}, \{6,2\}, \{4,0\} \rangle$.

The conversion of an unordered partition to an ordered partition can be done in as many z! ways. Some of these may be more advantageous than others. An ordering that results in common source words used to produce the subsets of $S_i$ and $S_k$ (corresponding to different ordered partitions) can be useful when the mapping unit is used as part of a larger design. This is because the same z-bit source words can be used to produce both $S_i$ and $S_k$. Table 5 demonstrates two ordered partitions for $S_0$ and $S_1$, resulting in two sets of source words for each set. Note that using ordered partition $\langle \{7,5,3,1\}, \{6,2\}, \{4\}, \{0\} \rangle$ for $S_0$ and $\langle \{7,6,5,4\}, \{3,2\}, \{1\}, \{0\} \rangle$ for $S_1$ results in the same set of 4 source words for both sets of subsets. We describe a similar effect for binary reductions (discussed later).

It can be shown that, if the partitions of the mapping unit $MU(z,y,n,\alpha)$ are not fixed, then the mapping unit can generate a number of independent subsets $\geq 2^y [\log z]$, provided $2^y \log z \leq 2^x$. If the partitions are fixed and $z+y \leq n$, then it can be proved that the number of independent subsets is 0.

TABLE 5

Two different orderings for the partitions of sets Se and $S_1$ resulting in different sets of source words used to produce the subsets in each set.

| $S_j^i$ | $\vec{\pi}$ | z-bit value | Q |
|---|---|---|---|
| $S_0^0$ | $\langle \{7, 5, 3, 1\}, \{6, 2\}, \{4\}, \{0\} \rangle$ | 1111 | 11111111 |
| $S_1^0$ | | 0111 | 01010101 |
| $S_2^0$ | | 0011 | 00010001 |
| $S_3^0$ | | 0001 | 00000001 |
| $S_0^0$ | $\langle \{4\}, \{6, 2\}, \{7, 5, 3, 1\}, \{0\} \rangle$ | 1111 | 11111111 |
| $S_1^0$ | | 1101 | 01010101 |
| $S_2^0$ | | 1001 | 00010001 |
| $S_3^0$ | | 0001 | 00000001 |
| $S_0^1$ | $\langle \{7, 6, 5, 4\}, \{3, 2\}, \{1\}, \{0\} \rangle$ | 1111 | 11111111 |
| $S_1^1$ | | 0111 | 00001111 |
| $S_2^1$ | | 0011 | 00000011 |
| $S_3^1$ | | 0001 | 00000001 |
| $S_0^1$ | $\langle \{3, 2\}, \{0\}, \{7, 5, 4\}, \{1\} \rangle$ | 1111 | 11111111 |
| $S_1^1$ | | 1101 | 00001111 |
| $S_2^1$ | | 0101 | 00000011 |
| $S_3^1$ | | 0100 | 00000001 |

It can be shown that for integers $n, z \geq 2$, and $$\varepsilon = \left\lceil \frac{n}{z-1} \right\rceil$$

there exists a mapping unit that uses C values from $\{0, 1, \ldots, 2^z - 1\}$ as source words and ordered partitions to produce CY distinct subsets. That is, it is possible to construct a mapping unit with z+y bits of input (where $$y \leq \left\lceil \frac{n}{z-1} \right\rceil$$

produces $2^y(2^z-2)$ distinct outputs (which is not too far from the theoretically maximum possible number of $2^{y+z}=2^y 2^x$ distinct outputs).

Checking a Partition for Realizability:

Suppose a partition places output word indices i and j in the same block. Suppose the hardwired connections are such that no bit of the source word connects to both MUXs i and j. In this case, we cannot select a source word bit to multicast to output word bits i and j. That is, the given partition cannot be realized on the existing hardwired connections.

Here we present an algorithm that determines whether a given partition can be realized on a given set of hardwired connections, and if so, the algorithm determines a way to order the partition so that it can be realized.

For each output word bit position $0 \leq j < n$, let $G_j$ denote the set of source word bits that have been hardwired to one of the data inputs of the MUX at position j. For example in the mapping unit of FIG. 15, the multiplexers at output position 4 is connected to source word positions 1, 2 and 3. Similarly output position 5 (resp., 6) is connected to source word positions 0 and 3 (resp., 2 and 3). Thus $G_4=\{1,2,3\}$, $G_5=\{0,3\}$ and $G_6=\{2,3\}$. For any subset B of $Z_n$ (representing output positions), define the set $H_B$ to be the set of source word indices that are connected to MUXs at every one of the output positions in B. That is, $$H_B = \cap_{j \in B} G_j$$

Call the set $H_B$, the source set of block B (with respect to the given set of hardwired connections).

A partition $\pi$ is said to be realizable on a set of hardwired connections between the source word and MUX inputs if and only if there exists for each output position j, an assignment of a source word position $i_j$, such that for any two output bit positions $0 \leq j, j' < n$ in (not necessarily distinct) blocks B and B' of $\pi$ (a) $i_j \in H_B$ and $i_{j'} \in H_{B'}$ (b) If B=B', then $i_j = i_{j'}$; call this common source word position $i_B$ (c) If B≠B', then $i_j \neq i_{j'}$.

The intuition is that the hardwired connections support a multicast from source word bit $i_j$ to output position j. Since $i_j$ is unique to the block containing j, the multicast is restricted to be within a block. In fact, the indices $i_j$ convert n into the ordered partition $\vec{\pi}$.

Clearly, a given partition may not be realizable on a set of hardwired connections. Is it possible to check if a given partition n is realizable, and if so, order it accordingly?

Given $\pi$, construct a bipartite graph $g_\pi = (Z_z \cup \pi, E)$; that is, the set of nodes includes the bit positions of the source word and the blocks of TE. For any $i \in Z_z$ and $B \in \pi$, there is an edge between i and B if and only if $i \in H_B$.

For any graph, a matching on the graph is a set of edges of the graph such that no two edges are incident on the same node. A matching is a maximum matching, if no other matching has more edges than it.

Let the given partition $\pi$ have k blocks. We now show that the $\pi$ is realizable if and only if g has a matching with k edges. Suppose $g_\pi$ has a matching with k edges. Clearly, this matching cannot include an edge that is incident on more than one block. Therefore the matching has exactly one edge per block. Each edge in a matching matches a block B to a unique source word bit position in the source set, $H_B$, of B. This implies that π is realizable and in fact, the matching gives an order that must be imposed on π Conversely, if π is realizable, then it must have a unique source word index $i_B \in Z_z$, for each block B, such that $i_B \in H_B$. Since $i_B \in H_B$, we have an edge between $i_B$ and B in graph $g_\pi$. Consequently, the unique correspondence to each block B from a source word position $i_B$ constitutes a matching with k edges. Finally observe that if a k-element matching exists, then it must be a maximum matching as no matching can have more edges than there are blocks in the partition; this is because at most one edge in a matching can be incident on each node representing a block.

A simple method to impose a realizable order (if one exists) on an unordered partition is to find a maximum matching for its graph. If it has k edges (k is the number of blocks in π), then use it as indicated above to order π. If the matching has less than k edges, then no k-edge maximum matching exists and π is not realizable on the set of hardwired connections. Standard polynomial-time algorithms exist for maximum matchings on a bipartite graph.

Call the above algorithm for imposing a realizable order (if possible) on a partition as Procedure Realizable.

Constructing Realizable Partitions:

Here we outline a strategy that invokes Procedure Part_Gen and Procedure Realizable to help produce a set of realizable partitions on the existing hardwired connections. We need to include all sets of S in the set of partitions, while keeping the number of partitions small. Key to doing this successfully is to order the elements of S "appropriately."

Let B be a block of a partition π. Clearly as B increases in size, $H_B$ tends to decreases in size. In fact, it is possible for $H_B$ to be empty, in which case the partition is clearly not realizable. If hardwired connections were random, a good strategy would be to construct partitions whose blocks have roughly the same size. This could be a guiding principle for the algorithm. If the hardwired connections follow some pattern, then that information could be used to develop a heuristic to select partitions with small blocks.

In general, determining an order that results in a realizable z-partition is not easy. In fact it is possible for the partition $\pi_S$ induced by a single subset S to be unrealizable.

We outline a strategy to construct realizable partitions for a given set of subsets. The strategy has three phases.

In the first phase we examine different orders for the elements of the given set S (that is, we consider different $\vec{S}$), then call Procedure Part_Gen collecting as many large partitions (with "nearly" z-blocks) as possible. Between each call to Procedure Part_Gen, we remove the subsets accounted for so far from S. The orders considered in this phase may be based on some knowledge of the subsets to be generated.

The second phase is based on the observation that a partition with fewer blocks has a higher likelihood of being realizable. In this phase we repeat the processing in the first phase, this time calling Procedure Part_Gen with different values for the second parameter that limits the number of blocks in a partition. That is, we try to construct a partition with many blocks, but will settle for one with few blocks, if necessary.

The third phase is needed for those subsets $S_i \delta S$ for which $\pi_S$, itself is not realizable. The third phase splits these subsets $S_i$ further with the aim of generating the elements of $S_i$ a few at a time. This is similar to the approach followed by bit-slice mapping units (described later). In the extreme case if $S_i$ is generated one element at, a time, the strategy uses the same method currently followed in one-hot decoders.

The above approach will generate a set of realizable partitions. How small this set will be will depend on S and the amount of resources (time, memory etc.) that can be devoted to the algorithm. Although generation of an optimal number of realizable partitions is likely an intractable problem, many practical algorithms and the subsets they require exhibit a lot of structure, which makes them amenable to more analytical approaches (as illustrated in Section 4.3).

We now discuss approaches to hardwire a mapping unit and to configure a configurable mapping unit.

Configuring a Configurable Mapping Unit:

Consider now a set of $2^v$ partition $\pi_k$ (where $0 \le k < 2^v$), each of which is realizable on a set of hardwired connections. By the definition of realizability, we have ordered $\pi_k$ into an ordered partition $\vec{\pi}_k$. Let $i_j^k$ be the source word position associated with output j in some block $B \in \vec{\pi}_k$. This implies that source word bit $i_j^k \in G_j$; that is, source word bit is connected to some input (say input $\gamma j^k$) of the MUX corresponding to output j.

The configuration LUT consists of $2^v$ words, each ny bits long. Denote the $k^{th}$ word by the n-tuple $\langle w_k, 0, w_k, 1, \ldots, w_k, n-1 \rangle$, where for any $0 \le j < n$, we have $0 \le w_{k,j} < y$. Configure the LUT so that $w_{k,j} = \gamma_j^k$. This will ensure that whenever line k of the LUT (or partition $\vec{\pi}_k$) is addressed, it will activate input $\gamma_j^k$ of the MUX (or bit $i_j^k$ of the source word) as required.

Hardwiring a Mapping Unit:

Here we offer approaches to hardwiring a mapping unit (at manufacture) in a manner that makes some classes of partitions realizable.

For $0 \le l < 2^v$ and $0 \le j < n$, let $m_{l,j}$ represent input l of multiplexer j. The aim is to assign each of these multiplexer inputs to one of the z source word bits $S_0, S_1, \ldots, S_{z-1}$.

Map input $m_{l,j}$ to bit $S_q$, where $q = (l + 2^v j) (\bmod z)$. We called this mapping "overlapped mapping." For example, if $y=2, z=5$ and $n=16$, then the sequence of source word bit indices is as follows:

| source word bits | | | | | | | | | | | | | | | |
|---|---|---|---|---|---|---|---|---|---|---|---|---|---|---|---|
| 0123 | 1234 | 2340 | 3401 | 4012 | 0123 | 1234 | 2340 | 3401 | 4012 | 0123 | 1234 | 2340 | 3401 | 4012 | 0123 |
| 0 | 1 | 2 | 3 | 4 | 5 | 8 | 7 | 8 | 9 | 10 | 11 | 12 | 13 | 14 | 15 |
| | | | | | | | output bit | | | | | | | | |

With overlapped mapping, a set of q consecutive multiplexers have $2^v - (q-1)$ common source word bits. If Q is a block of an unordered partition, then any of these common source word bits form $H_Q$ and can be used to assign the order of the block as indicated earlier.

As an example with $n=16$ and $z=5$, consider the partition $\pi = \{B_0, B_1, B_2, B_3, B_4\} = \{\{0,1,2,3\}, \{4\}, \{5,6,7\}, \{8,9,10,11\}, \{12,13,14,15\}\}$. Here $H_{B_0} = \{3\}$, $H_{B_1} = \{0,1,2,4\}$, $H_{B_2} = \{2,3\}$, $H_{B_3} = \{1\}$ and $H_{B_4} = \{0\}$. Assigning source word bits $s_3, s_4, s_2, s_1, s_0$ to blocks $B_0, B_1, B_2, B_3, B_4$ achieves the desired order. In general, this approach works well when subsets include proximate indices. However, the method is not guaranteed to work under all situations.

When additional flexibility is needed from the hardwiring, one could use "post-permutation," in which overlapped mapping is applied to a permutation of the output and then the outputs permuted back as required. We illustrate this technique below.

In the earlier example of the section entitled "Hardwiring a mapping unit:" suppose that $\pi'=B'_0,B'_1,B'_2,B'_3,B'_4$ where $B'_0=\{0,1,2,3\}$, $B'_1=\{4\}$, $B'_2=\{5,6,7\}$, $B'_3=\{10,11,12,13\}$ and $B'_4=\{8,9,14,15\}$. The corresponding sets $H_{B'_i}$ are $\{3\}$, $\{0,1,2,4\}$, $\{2,3\}$, $\{3\}$, and $\{0,1\}$, respectively. Clearly, we cannot assign a unique source word bit to each block as $H=H_{B'_0}\cap H_{B'_3}=\{3\}$; that is, both $H_{B'_0}$ and $H_{B'_3}$ have 3 as the only possible source word bit to connect to. If we use the partition $\pi$ described earlier and permute the outputs so that $B_i$ maps to $H_{B'_i}$ for each $0\leq i\leq 4$, we get the desired output as shown in FIG. 16.

This post permutation can be achieved by a butterfly network whose switches are configurable 2-input multiplexers. This network has a $0(n \log n)$ gate cost and $0(\log n)$ delay; that would not significantly alter the cost of the mapping unit in most cases. Also the network can be configured as needed using standard permutation-routing algorithms for the butterfly network. It may also be possible to use a butterfly network with fewer than the standard $1+\log n$ stages as permutations among proximate outputs may not be required. This would further reduce the cost of the butterfly network.

However, the butterfly network is a blocking network (that is, certain permutations cannot be achieved). In principle, other (more expensive) non-blocking permutation networks can be employed to overcome this problem.

It must be noted that we are mapping an realizable block $B'$ to a required block $B$, where $B$ and $B'$ have the same number of elements. If $B$ and $B'$ each contain m elements, then within these blocks the elements can be mapped in m! ways. Thus, there may be a lot of room for the designer to avoid blocking in networks such as the butterfly.

Although this method does not guarantee that the hardwiring would allow every partition to be realizable, many practical problems that exhibit regularity and structure tend to be more amenable to analytical approaches and individualized fine-tuning

4.1.3 Hybrid Mapping Units

In previous sections we described the fixed and configurable mapping units. While configurable mapping units provide more flexibility, they are more expensive than fixed mapping units. If the application does not call for such a flexibility, a fixed mapping unit may be preferable. Here we describe two hybrid mapping units that use elements of both the fixed and variable mapping units and occupy a middle ground between the flexibility and cost of the fixed and configurable mapping units.

A fixed mapping unit MU $(z,y,n,\alpha)$ fans-out the y-bit selector address to all n MUXs (shown as signals $B_0, B_1, \ldots, B_{n-1}$; here $B_0=B_1=\ldots=B_{n-1}$. In contrast, these ny bits of MUX control come from the configuration LUT in a configurable mapping unit; here y selector address bits are used to address at most $2^y$ LUT locations, each ny bits long. In this case the signals $B_0, B_1, \ldots, B_{n-1}$ are completely independent of each other. We now describe two hybrid schemes.

Hybrid Mapping Unit 1:

Let $Z_n$ be the set of (indices of) MUXs in the mapping unit. Divide this set into two disjoint subsets F and R (in any convenient manner that may depend on the application area). Use the y-bit selector address (suitably fanned out) to directly control all MUXs whose indices are in F; that is for all $i \in F$, the value of $B_i$ equals the value of the y-bits input to the mapping unit as in a fixed mapping unit. The remaining MUXs (with indices in $R=Z_n-F$) receive their control inputs from the control LUT as in a configurable mapping unit. If R contains $l \leq n$ elements, then each LUT word has a size of ly bits. The advantage of this approach is that the LUT need not be as large as in a configurable mapping unit.

Hybrid Mapping Unit 2:

As before, let $Z_n$ represent the set of MUXs in the mapping unit. For some integer $1 \leq l < n$, partition $Z_n$ into l blocks; Let this partition be $\{R_0, R_1, \ldots, R_{l-1}\}$. (This partition has nothing to do with the partition of the outputs associated with the multicast from the source word bits.) Use a configuration LUT with wordsize ly. If a configuration word has the form $\langle \widehat{B_0}, \widehat{B_1}, \ldots, \widehat{B_{l-1}} \rangle$, then each MUX with index $i \in R_j$ receives control input $\widehat{b_j}$. As before, this reduces the size of the configuration LUT.

The advantage of both hybrids is that they reduce the size of the LUT word to $ly < ny$. This reduces the cost of the LUT if its size is kept the same. Alternatively, this can also allow one to increase the number of words in the LUT for the same cost as in the configurable mapping unit. An implication of this is that the configuration LUT can now store more partitions (say $2^{y'}$ partitions for some $y' > y$) for the same cost as the configurable mapping unit. This would require $y'$ bits to be input to the configuration LUT. However, only y of these bits would be used with F and each MUX (regardless of whether it is in F or R) would still use y control bits and, consequently, we would still hardwire only $2^y$ source word bits to each MUX. This is needed to keep the collective cost of the n MUXs the same as before.

The hybrid mapping units can be viewed as a generalizations of the fixed and configurable mapping units. For the first hybrid, when $F=Z_n$ (or $R=\emptyset$), we have the fixed mapping unit and when $R=Z_n$ (or $F=\emptyset$) we have the configurable mapping unit. The second hybrid is a generalization of the configurable mapping unit; if $l=n$, then we have the standard configurable mapping unit. When $l=1$, then all MUXs received the same control signal as in the fixed mapping unit, but if a LUT of wordsize y is used, then the y control bits of the MUXs need not be the same as they (or $y'$) bits input to the mapping unit.

4.1.4 Universal Mapping Unit

A mapping unit MU $(z,y,n,\alpha)$ is universal if and only if it can, under configuration, produce any set of $2_y$ log z independent subsets of $Z_n$. It can be shown that a configurable mapping unit with $z=2^y$ is universal. This is because, when $z \leq 2^y$, each bit of the source word can be input to every MUX. Consequently, any partition B has $H_B = \{0, 1, \ldots, z-1\}$. Thus a universal mapping unit MU $(2^y, y, n, \alpha)$ with $0(ny2^y)$ gate cost and $0(y+\log n)$ delay exists.

It is not known whether this is the only universal mapping unit.

4.1.5 Bit-Slice Mapping Units

A bit-slice mapping unit generates just part of the output subset (represented by an n-bit word) at a time. It constructs a subset over $\alpha$ iterations, generating $$\frac{n}{\alpha}$$

bits in each iteration. This allows the mapping unit to exploit repeated patterns, such as these demonstrated in Table 6, representing two forms of reduction. Notice that to generate 8 words, each 16 bits long, only 6 words, each 4 bits long, need to be generated.

TABLE 6

Subsets with repeated patterns for n = 16 and α = 4.

| Subset S | Repeated Patterns |
|---|---|
| 1111111111111111 | 1111 |
| 0001000100010001 | 0001 |
| 0000000100000001 | 0000, 0001 |
| 0000000000000001 | 0000, 0001 |
| 0000000011111111 | 0000, 1111 |
| 0000000000001111 | 0000, 1111 |
| 0000000000000011 | 0000, 0011 |
| 0000000000000001 | 0000, 0001 |

For example, the subset S corresponding to word 0001000100010001 can be constructed over 4 iterations using the bit pattern 0001. Overall, this allows the bit-slice mapping unit to decrease the required gate cost of its internal components in situations where an increased delay is tolerable.

A possible implementation of $MU(z,y,n,\alpha)$ is shown in FIG. 17. A shift register (SR) acts as a parallel to serial converter and stores the z-bit source words and outputs $$\frac{n}{\alpha}$$

bits every α cycles to the internal mapping unit $$MU\left(\frac{z}{\alpha}, y, \frac{n}{\alpha}, 1\right).$$

The $$\left(\frac{n}{\alpha}\right) - \text{bit}$$

output of the mapping unit is stored in another shift register which parallelizes the $$\frac{n}{\alpha} - \text{bit}$$

words into one n-bit word. A mod-α counter orchestrates this parallel to serial conversion by triggering a write-in operation on the input shift register and a write-out on the output shift register every α cycles. This allows a new source word to be input into the bit-slice mapping unit and an n-bit output q written out every α cycles.

Because the bit-slice mapping unit is a sequential circuit, we modify the definition of delay. For sequential circuits, we assume that the clock delay of the circuit to be the longer of (a) the longest path between any flip-flop output and any flip-flop input and (b) the longest path between any circuit input and output. Using this notion of delay, it can be shown that a bit-slice mapping unit $MU(z,y,n,\alpha)$ can be realized in a circuit with a gate costs of $$O\left(\log^2 \alpha + n\left(1 + \frac{y^{2y}}{\alpha}\right)\right)$$

and a delay of $O(a(\log \log \alpha + \log n + y))$, and the number of independent subsets is $$\lambda = \frac{2^y}{\alpha} \cdot \left[\log \frac{z}{\alpha}\right]$$

and the maximum total number of subsets producible is $\Lambda = 2^y (2^z - 2)$, provided $$y < \left[\frac{n}{z-1}\right].$$

A point that that needs attention is the matter of how partitions play out in the bit-slice mapping unit. For example, the subsets of Table 6 produced by a fixed mapping unit $MU(z,y,n,\alpha)$ with z=5, $2^y$=2 require two ordered partitions $$\vec{\pi}_1 = \langle \{15,14,13,11,10,9,7,6,5,3,2,1\},\{12,4\},\{8\},\{0\} \rangle$$

and $$\vec{\pi}_2 = \langle \{15,14,13,12,11,10,9,8\},\{7,6,5,4\},\{3,2\},\{1\}, \{0\} \rangle$$

and four, 5-bit source words (11111, 00111, 00011, 00001) to produce the n=16-bit outputs. In a bit-slice mapping unit, with $$\left[\frac{z}{\alpha}\right] = 2,$$

and $$\frac{n}{\alpha} = 4,$$

two ordered partitions $\vec{n}'_1 = \langle \{3,2\},\{1,0\} \rangle$ and $\vec{\pi}'_2 = \langle \{3,2,1\},\{0\} \rangle$ (on a smaller 4-element set) and just three, 2-bit source words (00, 01, and 11) are needed to produce the $$\frac{n}{\alpha} - \text{bit}$$

repeated patterns 0011, 0001, 0000, and 1111. For the particular subsets of $Z_n$ shown in Table 6, the bit-slice mapping unit shows good savings. In determining whether or not a bit-slice mapping unit is suitable to a design, a variety of considerations must be taken into account.

Overall a mapping unit (fixed, configurable, integral or bit-slice) $MU(z, y, n, \alpha)$ has the following parameters.
(a) delay of $O(\alpha(y+\log n))$,
(b) gate cost of $$O\left(n\left(1 + \frac{y^{2y}}{\alpha}\right)\right),$$

(c) number of independent subsets producible=

$$\lambda = \frac{2^y}{\alpha} \left[\log \frac{z}{\alpha}\right],$$

and
(d) maximum number of subsets producible=$\Lambda = 2^y (2^z - 2)$, provided $$y < \left\lceil \frac{n}{z-1} \right\rceil.$$

4.2 A Mapping-Unit-Based Configurable Decoder

A configurable decoder has the same basic functionality as a fixed decoder. An x-to-n configurable decoder accepts an x-bit input word and outputs up to $2^x$ outputs, each n bits wide. Unlike fixed decoders, the output of a configurable decoder is not fixed at manufacture. With configuration, the n-bit outputs can be changed to a different pattern of bits, thus supplying a degree of flexibility not present in fixed decoders.

A $2^x \times n$ look-up table or LUT may be considered as a type of x-to-n configurable decoder. A $2^x \times n$ LUT also takes in an x-bit input word and outputs up to $2^x$ words, each n bit wide, where the n-bit words are determined by the contents of the LUT's memory array. Unfortunately, this "LUT decoder" is expensive, where the gate cost of is $0(2^x(x+n))$. If this decoder was implemented on the same scale as a log n-to-n one-hot decoder, then x=log n. This results in a decoder that, while able to produce (after configuration) any of the $2^n$ subsets of $Z_n$, has a gate cost of $\theta(n^2)$. On the other hand, if the LUT decoder were restricted to the same asymptotic gate cost as the one-hot decoder (that is, $\theta(n \log n)$), it would only be able to produce $\theta(\log n)$ subsets of $Z_n$ (being at most a log n×n LUT). Although the flexibility of the LUT decoder is desirable, its cost does not scale well and an alternative is needed.

The configurable decoder described here is a circuit that uses a LUT (with a smaller order of cost), combined with a mapping unit. The mapping units we consider have the same order of cost as the LUT, and this allows the LUT cost to be kept as small as a fixed decoder while allowing a large number of n-bit subsets to be produced within the same order of gate cost as fixed decoders. We call these "mapping-unit-based" configurable decoders (or MU-B decoders). They take the same forms as the mapping unit itself: be integral or bit-slice, fixed or configurable. It should be noted that the MU-B decoder is always configurable, as even one using a fixed mapping unit employs a LUT.

By incorporating a "narrow" output LUT with a mapping unit that expands this narrow output into a wide n-bit output representing a subset of $Z_n$, a device is obtained that is reduced in cost (compared to a LUT decoder) but has substantial flexibility. FIG. 18 shows a block diagram of the mapping-unit-based decoder. To put the figure in perspective, x<<z<<n, generally. Unlike the LOT decoder solution, this solution expands the x-bit input in stages to construct the n-bit output.

As FIG. 18 shows, the x-to-n MU-B decoder (denoted by MUB (x,z,y,n,$\alpha$)) has two main components, a $2^x \times z$ LUT and a mapping unit MU (z,y,n,$\alpha$). The LUT maps an x-bit input to a narrow z-bit word. The mapping unit MU (z,y,n,$\alpha$) accepts this z-bit LUT output as an input source word u. It also accepts an ordered partition $\vec{\pi}$ as indirectly selected by the y-bit selector word B). The MU (z,y,n,$\alpha$) then uses the operation $\mu(u, \vec{\pi})$ to produce an n-bit word representative of a subset of $Z_n$. Any MU(z,y,n,$\alpha$) in combination with a $2^x \times z$ LUT (or other type of memory) is considered a type of MU-B decoder, MUB(x,z,y,n,$\alpha$) as shown in FIG. 18.

The flexibility of the MU-B decoder depends on the LUT and the value of z, the size of the source word. While z larger than a low-degree polynomial in n does not yield significant benefits and increases the LUT cost, a small z (such as z=log n) severely limits the number of independent subsets that can be generated by the mapping unit. Without the LUT, z has to be this small to address the pin limitation problem. Thus the role of the LUT is to start from a small number of input bits and expand it to z bits, trading the value of z off with the number of locations in the LUT. This provides room for constructing the MU-B decoder to particular specifications.

The next example illustrates a MU-B decoder with a bit-slice mapping unit. Consider the sets $S_0 = \{S_0^0, S_1^0, S_2^0, S_3^0\}$ and $S_1 = \{S_0^1, S_1^1, S_2^1, S_3^1\}$ shown in Table 7. Let $S = S_0 \cup S_1$ and let z=5 and $2^y$=2. It is easy to verify that the ordered partitions for sets $S_0$, $S_1$ are $$\vec{\pi}_0 = \langle \{15,13,11,9,7,5,3,1\},\{14,10,6,2\},\{12,4\},\{8\},\{0\}\rangle$$

and $$\vec{\pi}_1 = \langle \{15,14,13,12,11,10,9,8\},\{7,6,5,4\},\{3,2\},\{1\},\{0\}\rangle,$$

respectively. Then MUB(x,z,y,n, 1) fixed mapping unit would require 16 multiplexers with 2 inputs each and a 5×5 LUT to hold the values of the source words (note that this is due to an intelligent ordering; in general the LUT could be as large as a 10×5).

Now assume that, $\alpha$=log n=4. Then in each iteration, the decoder must produce the $$\frac{n}{\alpha} = 4$$

bit words from the $$\frac{z}{\alpha} = 2$$

bit words shown in Table 8.

TABLE 7

| | Set S = $S_0 \cup S_1$ | |
|---|---|---|
| $S_j^i$ | $q \in Q$ | z |
| $S_0^0$ | 1111111111111111 | 1111 |
| $S_1^0$ | 010101010101010 | 0111 |
| $S_2^0$ | 000100010001000 | 0011 |
| $S_3^0$ | 000000010000000 | 0001 |
| $S_4^0$ | 000000000000000 | 0000 |
| $S_0^1$ | 1111111111111111 | 1111 |
| $S_1^1$ | 000000001111111 | 0111 |
| $S_2^1$ | 000000000000111 | 0011 |
| $S_3^1$ | 000000000000001 | 0001 |
| $S_4^1$ | 000000000000000 | 0000 |

For these $$\frac{n}{\alpha}$$

words, three partitions are needed, $$\vec{\pi}_0^{bs} = \langle \{3,2\},\{1,0\}\rangle,$$

$$\vec{\pi}_1^{bs} = \langle \{3,1\},\{2,0\}\rangle,$$

$$\vec{\pi}_2^{bs} = \langle \{3,2,1\},\{0\}\rangle,$$

Since the original fixed mapping unit had values of z=5 and $2^y$=2, the number of inputs to each multiplexer in the internal mapping unit of the bit-slice mapping unit would increase by one (from 2 to 3). However, the number of multiplexers would decrease from n=16 to $$\frac{n}{\alpha} = 4.$$

This would imply a reduction is cost by a factor of $$\frac{16 \times 2}{4 \times 3} \approx 2.67.$$

Regardless, the LUT must still supply a z-bit word to the bit-slice mapping unit (which in this case may increase to a 6-bit word based on the rounding up of $$\left\lceil \frac{z}{\alpha} \right\rceil).$$

Thus, the implementation depends on the allowable costs, the number of z-bit source words and the corresponding size of the LUT, and the subsets that must be produced. Further, the ordering of the partitions can determine not only the size of

TABLE 8

Source and output words for S.

| $S_j^i$ | $\frac{z}{\alpha}$ - bit input word | $\frac{n}{\alpha}$ - bit word produced |
|---|---|---|
| $S_0^0$ | 11 | 1111 |
| $S_1^0$ | 01 | 0101 |
| $S_2^0$ | 01 | 0001 |
| $S_3^0$ | 00, 01 | 0000, 0001 |
| $S_4^0$ | 00, 01 | 0000, 0001 |
| $S_0^1$ | 11 | 1111 |
| $S_1^1$ | 00, 11 | 0000, 1111 |
| $S_2^1$ | 00, 11 | 0000, 1111 |
| $S_3^1$ | 00, 01 | 0000, 0011 |
| $S_4^1$ | 00, 01 | 0000, 0001 | the LUT in the MU-B decoder (and thus also the values of its parameters), but also dictate the subsets that can be produced.

It can be shown that: for any $\alpha \geq 1$, a mapping-unit-based configurable decoder MUB(x,z,y,n,$\alpha$) has a delay of O(x+log z+$\alpha$(y+log n)) and a gate cost of $$O\left(2^x(x+z) + n\left(1 + \frac{y 2^y}{\alpha}\right)\right);$$

further, MUB (x,z,y,n,$\alpha$) can produce at least $$\lambda = \min\left\{2^x, \frac{2^y}{\alpha}\left\lceil \frac{\log z}{\alpha} \right\rceil\right\}$$

independent sets. Finally it can be shown that if $2^x \leq 2^z - 2$, and $$y \leq \left\lceil \frac{n}{z-1} \right\rceil - 1),$$

then a MUB(x, z, y, n, $\alpha$) can be built that produces $2^{x+y}$ distinct subsets of $Z_n$.

Finally, to properly compare a LUT decoder with MUB(x, z, y, n, $\alpha$), the following can be shown:

Let P be a LUT decoder, and let C be the proposed mapping-unit-based configurable decoder, each producing subsets of $Z_n$. If both decoders have a gate cost G, such that G=$\Omega$(n) and G is polynomially bounded in n, then for constant $\pi$>0, (a) When G=$\theta$(n log$^\sigma$ n), then C can produce a factor of $$\theta\left(\frac{\log n}{\log \log n}\right)$$

more independent subsets then P, and can produce a factor of $$\theta\left(\frac{n^\varepsilon \log^\sigma n}{\log \log n}\right)$$

more dependent subsets, where $0 \in <1$.

(b) When G=$n^{1+\sigma}$, then C would produce the same order of independent subsets as P and is capable of producing up to $$\theta\left(\frac{G}{n}\left(\frac{n^\varepsilon}{\log^\sigma n}\right)\right)$$

dependent subsets, for any $0 \leq \varepsilon < 1$.

The above results indicate that with comparable cost for the LUT decoder and the proposed mapping-unit-based configurable decoder, the MU-B decoder is more flexible, generating more subsets than the LUT decoder.

4.3 Particular Instances of the MU-B Decoder

Many applications and algorithmic paradigms display standard patterns of resource use. Here we examine three cases: (1) Binary Reduction, (2) one-hot and (3) Ascend/Descend.

Binary Reduction (in General, a Total Order of Subsets):

Consider the binary tree reductions (or simply binary reductions), shown in FIG. 19. In each reduction, the number of resources is reduced by a factor of two in each level of the tree; FIGS. 19(a) and (b) illustrate this for two particular reductions. The bit patterns representing these reductions are also shown, where a bit has a value of '1' if it survives the reduction at a particular level in the tree and a value of '0' if it does not. In general, we denote the subset of $Z_n$ used during iteration i of a binary reduction (where $0 \leq i \leq \log n$) by $S_i$.

In discussing binary reduction, we consider a more general case involving a set S of totally ordered subsets. Let S={$S_0$, $S_1$, ..., $S_{k-1}$} be a set of k subsets of $Z_n$ such that $S_0 \supset S_1 \supset ... \supset S_{k-1}$; that is, the elements of S are totally ordered by the "proper superset of relation. For each $0 \leq i < k$, let $\pi_{S_i}$ denote the partition induced by $S_i$. It can be shown that $$\pi = \pi_{S_0} \cdot \pi_{S_1} \ldots \pi_{S_{k-1}} = \begin{cases} \{S_0, S_1 - S_0, S_2 - S_1, \ldots, S_{k-1} - S_{k-2}, Z_n - S_{k-1}\}, & \text{if } S_{k-1} = Z_n \\ \{S_0, S_1 - S_0, S_2 - S_1, \ldots, S_{k-1} - S_{k-2}\}, & \text{if } S_{k-1} \subset Z_n \end{cases}$$

For binary reduction, k=1+log n=log 2n in the above notation and $S_{log\,n} = Z_n$.
Therefore, $$\pi = \{S_0, S_1 - S_0, S_2 - S_1, \ldots, S_{log\,n} - S_{log\,n-1}\}$$

has log 2n blocks.

Consider the two binary reductions of FIGS. 19(a) and (b). The ordering results in the subsets shown in Table 9.

The first reduction pattern has subsets $S_0^0 = \{0\}, S_1^0 = \{0,4\}$, $S_2^0 = \{0,2,4,6\}$ and $S_3^0 = \{0,1,2,3,4,5,6,7\}$. This results in the partition $\pi^0 = \{\{7,5,3,1\},\{6,2\},\{4\},\{0\}\}$. Similarly, the second reduction pattern produces the partition $\pi^1 = \{\{7,6,5,4\}, \{3,2\},\{1\},\{0\}\}$.

TABLE 9

Two binary tree based reduction patterns

| $S_0^i$ | n-bit pattern | $S_1^i$ | n-bit pattern |
|---|---|---|---|
| $S_0^0$ | 00000001 | $S_1^0$ | 00000001 |
| $S_0^1$ | 00010001 | $S_1^1$ | 00000011 |
| $S_0^2$ | 01010101 | $S_1^2$ | 00001111 |
| $S_0^3$ | 11111111 | $S_1^3$ | 11111111 |

A binary reduction corresponding to a partition $\pi = \{S_0, S_1 - S_0, S_2 - S_1, \ldots, S_{log\,n} - S_{log\,n-1}\}$ can be implemented on MUB (log log 2n, log 2n, 1, n., $\alpha$). A MUB (log log 2n, log 2n, y, n, $\alpha$) can implement $2^y$ different binary reductions. Since corresponding subsets in different binary reductions still have the same number of elements, the same set of log 2n source words can be used for all reductions; different ordered partitions need to be used, however.

The reduction corresponding to the unordered partition $\pi^0 = \{\{7,5,3,1\},\{6,2\},\{4\},\{0\}\}$ can be ordered so that the blocks (in the order shown) correspond to source words bits 3, 2, 1, 0 (where 0 is the least significant bit or lsb). Thus, the output set (represented as an n-bit word with bit 0 as the lsb) produced by source word $s_3, s_2, s_1, s_0$ and the ordered partition is $s_3, s_2, s_3, s_1, s_3, s_2, s_3, s_0$. To produce the sets $S_0^0, S_1^0, S_2^0, S_3^0$ the source words are 0001, 0011, 0111, 1111, respectively. If we now order $\pi^1 = \{\{7,6,5,4\},\{3,2\},\{1\},\{0\}\}$ so that the blocks (in the order shown) correspond to source word bits 3,2,1,0, then it is easy to verify that the same source words 0001, 0011, 0111, 1111 produce sets $S_0^1, S_1^1, S_2^1, S_3^1$, respectively.

One-Hot Decoders:

A set of one-hot subsets is a set of subsets of $Z_n$ each represented by an n-bit output word with each output word having only one active bit (usually with a value of '1'), all other bits being inactive (usually '0'). (The ideas we present also apply to decoders using an active-low logic where a '0' represents inclusion of an element of $Z_n$, in the subset and '1' represents exclusion of the element from the subset.) Table 10 shows an example for active-high logic. The structure of the partition induced by a set of one-hot subsets is a particular case of a set of disjoint subsets, that we now describe. Let $S = \{S_0, S_1, \ldots, S_{k-1}\}$ be a set of subsets of $Z_n$, that are pairwise disjoint; that is, for any $0 \le i,j < k, S_i \cap S_j = \emptyset$. Let $S_k = Z_n - (S_0 \cup S_1 \cup \ldots \cup S_{k-1})$. It can be shown that the partition induced by the sets in S is $$\pi = \begin{cases} \{S_0, S_1, \ldots, S_{k-1}\}, & \text{if } S_k = \phi \\ \{S_0, S_1, \ldots, S_{k-1}, S_k\}, & \text{if } S_k \ne \phi \end{cases}$$

Thus if the given set S has k disjoint subsets, then the partition induced by S has at most k+1 blocks. For the one-hot set of subsets, k=n and the induced partition is $\{\{0\},\{1\}, \ldots, \{n-1\}\}$. Moreover, because the subsets are disjoint, the product of any k-partitions $\pi_{S_i}$ induced by a set of k one-hot

TABLE 10

A set of 1-hot subsets of $Z_{16}$

| $S_i$ | n-bit value |
|---|---|
| $S_0$     | 0 0 0 0 0 0 0 0 0 0 0 0 0 0 0 1 |
| $S_1$     | 0 0 0 0 0 0 0 0 0 0 0 0 0 0 1 0 |
| $S_2$     | 0 0 0 0 0 0 0 0 0 0 0 0 0 1 0 0 |
| $S_3$     | 0 0 0 0 0 0 0 0 0 0 0 0 1 0 0 0 |
| $S_4$     | 0 0 0 0 0 0 0 0 0 0 0 1 0 0 0 0 |
| $S_5$     | 0 0 0 0 0 0 0 0 0 0 1 0 0 0 0 0 |
| $S_6$     | 0 0 0 0 0 0 0 0 0 1 0 0 0 0 0 0 |
| $S_7$     | 0 0 0 0 0 0 0 0 1 0 0 0 0 0 0 0 |
| $S_8$     | 0 0 0 0 0 0 0 1 0 0 0 0 0 0 0 0 |
| $S_9$     | 0 0 0 0 0 0 1 0 0 0 0 0 0 0 0 0 |
| $S_{10}$  | 0 0 0 0 0 1 0 0 0 0 0 0 0 0 0 0 |
| $S_{11}$  | 0 0 0 0 1 0 0 0 0 0 0 0 0 0 0 0 |
| $S_{12}$  | 0 0 0 1 0 0 0 0 0 0 0 0 0 0 0 0 |
| $S_{13}$  | 0 0 1 0 0 0 0 0 0 0 0 0 0 0 0 0 |
| $S_{14}$  | 0 1 0 0 0 0 0 0 0 0 0 0 0 0 0 0 |
| $S_{15}$  | 1 0 0 0 0 0 0 0 0 0 0 0 0 0 0 0 | subsets results in a partition with at least k blocks. Thus if we were to construct z-block-partitions, we will need $$\theta\left(\frac{n}{z}\right)$$

partitions to capture a set of one-hot subsets. This would require $$y = \theta\left(\log \frac{n}{z}\right) = \theta(\log n),$$

z is of substantially smaller order than n. This would make the gate cost of the MU-B decoder $$\Omega\left(\frac{n^2 \log n}{z}\right),$$

which is too high to be of practical value.

Thus, the 1-hot sets are easy to produce in a conventional fixed decoder, they present a difficult embodiment for the MU-B decoder described so far. One method of producing the 1-hot subsets in a MU-B decoder is to use a LUT with 2x=n rows (or x=log n). A LUT contains a 1-hot address decoder, and since a configurable decoder MUB(log n,z,y,n,$\alpha$) contains a n×z LUT, a simple switch allowing the output of the LUT's address decoder to be the output of the configurable decoder automatically allows the configurable decoder to produce the 1-hot subset. Also, the parallel decoder described subsequently teaches a simple way to construct a one-hot decoder out of MU-B decoders.

Ascend/Descend:

Communication patterns can also induce subsets. For example, if a node can either send or receive in a given communication, but not both simultaneously, then for the ASCEND/DESCEND communication patterns shown in FIG. 20 for n=8, the subsets generated are as indicated in the box in the figure. (The ASCEND/DESCEND communication patterns are also called normalized hypercube communication patterns).

The subsets of the Ascend/Descend class of communications are more difficult than those of the binary reduction for a mapping unit to produce. This is because the product of all induced partitions of the 2 log n subsets of the Ascend/Descend class of communications results in an n-partition of $Z_n$ as in the one-hot case; again as z<<n, this cannot be represented by a single z-partition. However, the partitions induced by ASCEND/DESCEND subsets can be combined more effectively.

For the next discussion, we recognize that ASCEND/DESCEND subsets are in complementary pairs that induce the same partition. In fact each level of the ASCEND/DESCEND algorithm has one complementary pair; that is, there one induced partition per level of the algorithm. For the moment, we consider just a set of log n ASCEND/DESCEND sets (one per level). It is easy to show that the product any k-partitions induced by k of ASCEND/DESCEND sets has $2^k$ blocks, each of size $$\frac{n}{2^k}.$$

Thus, one method of generating ASCEND/DESCEND subsets is to use $$\frac{\log n}{\log z}$$

z-partitions, each with 2 log z source words (where z is a power of 2, say $z=2^k$).

For example, the partition for the first level of communications is $\pi_1=\{\{7,5,3,1\},\{6,4,2,0\}\}$. Taken for log z such levels, this results in a single z-partition that with 2 log z source words can produce 2 log z of the different 2 log n subsets. For example, consider z=4. Then, log z=2, which implies that two levels can be represented by a single partition. If a partition represents levels one and two, then this results in the partition $\pi=\{\{7,3\},\{6,2\},\{5,1\},\{4,0\}\}$.

Taken for all 2 log n subsets, this results in a total of $$\frac{\log n}{\log z}$$

such partitions, and a total of 2 log z source words. Table 11 illustrates a possible ordering of the partitions and source words for the ASCEND/DESCEND sets shown in FIG. 20.

TABLE 11

Partitions and source words generated for ASCEND/DESCEND subsets for n = 8 and z = 4

| $S_i$ | $\vec{\pi}$ | Source | output word |
|---|---|---|---|
| $S_0$ | $\langle\{7,3\},(6,2),\{5,1\},\{4,0\}\rangle$ | 1010 | 10101010 |
| $S_1$ | | 0101 | 01010101 |
| $S_2$ | | 1100 | 11001100 |
| $S_3$ | | 0011 | 00110011 |
| $S_4$ | $\langle\{7,6,5,4\},\{3,2,1,0\}\rangle$ | dd10 | 11110000 |
| $S_5$ | | dd01 | 00001111 | d denotes a don't care value 4.4 Parallel Configurable Decoders

Decoders can be structured in a parallel configuration utilizing a merge operation (such as an associative Boolean operation) to combine the outputs of two or more decoders. A parallel embodiment using MU-B decoders will be denoted MUB (x,z,y,n,α,P) where the parameter P denotes the number of configurable d denotes a don't care value decoders connected in parallel. Although we present examples in which a parallel configurable decoder uses multiple instances of configurable decoders of the same size and type, they could, in principle, be all different.

4.4.1 Parallel, Configurable One-Hot Decoder

A parallel configurable decoder can produce sets of subsets of $Z_n$ not easily produced by the configurable decoders previously presented. The following example demonstrates the use of parallel decoders to produce the one-hot decoder.

Consider two subsets $S_0$, $S_1$ of $Z_n$. Assume that an integer m divides n, or n=km for some integer k. Then $Z_n=\{0, 1, \ldots, m-1, m, m+1, \ldots, 2m-1, 2m, \ldots, im-1, \ldots, (i+1)m-1, \ldots, (k-1)m, \ldots, km-1\}$. For $0 \le i < m$ and $$0 \le j < \frac{n}{m},$$

let $$q_{i,0}=\{i+ml:0\le l<k\}$$

and let $$q_{i,1}=\{jm+l:0\le l<m\}.$$

Clearly, $q_{i,0}$ and $q_{i,1}$ are subsets of $Z_n$. Table 12 illustrates the subsets for n=20 and m=4.

Let $S_0=\{q_{i,0} 0\le i<m\}$ and $$S_1 = \left\{q_{j,1}; 0 \le j < \frac{n}{m}\right\}.$$

Subsets $S_0$ and $S_1$ induce partitions $\pi_0=(q_{i,0}:0\le i<m\}$ and $$\pi_1 = \left\{q_{i,1}:0 \le j < \frac{n}{m}\right\},$$

respectively.
For $$=k=\frac{n}{m},$$

two z-partitions of n can generate these subsets. Put differently, each subset of $S_0$ and $S_1$ can be independently generated by different MU-B decoders, each using just one partition. Note that $q_{i,0} \cap q_{j,1} = \{jm+i\}$, and it can be shown that for each $x \in Z_n$, there exists unique values $0 \le i < m$ and $$0 \le j < \frac{n}{m}$$

such that $x \in q_{i,0} \cap q_{j,1}$, and hence $S = \{q_{i,0} \cap q_{j,1} : 0 \le i < m$ and $$0 \le j < \frac{n}{m}\}$$

is the set of one-hot subsets.

TABLE 12

Subsets $q_{i,0}$ and $q_{i,1}$ for n = 20 and m = 4

| $q_{i,0}$ | n-bit word |
|---|---|
| $q_{0,0}$ | 0 0 0 1 0 0 0 1 0 0 0 1 0 0 0 1 0 0 0 1 |
| $q_{1,0}$ | 0 0 1 0 0 0 1 0 0 0 1 0 0 0 1 0 0 0 1 0 |
| $q_{2,0}$ | 0 1 0 0 0 1 0 0 0 1 0 0 0 1 0 0 0 1 0 0 |
| $q_{3,0}$ | 1 0 0 0 1 0 0 0 1 0 0 0 1 0 0 0 1 0 0 0 |

| $q_{j,1}$ | n-bit word |
|---|---|
| $q_{0,1}$ | 0 0 0 0 0 0 0 0 0 0 0 0 0 0 0 0 1 1 1 1 |
| $q_{1,1}$ | 0 0 0 0 0 0 0 0 0 0 0 0 1 1 1 1 0 0 0 0 |
| $q_{2,1}$ | 0 0 0 0 0 0 0 0 1 1 1 1 0 0 0 0 0 0 0 0 |
| $q_{3,1}$ | 0 0 0 0 1 1 1 1 0 0 0 0 0 0 0 0 0 0 0 0 |
| $q_{4,1}$ | 1 1 1 1 0 0 0 0 0 0 0 0 0 0 0 0 0 0 0 0 |

A simple method to generate the one-hot subsets using parallel decoders is shown in FIG. 21.

If $m = \sqrt{n}$, then both m and $$\frac{n}{m}$$

form feasible values for the input for a mapping unit; that is, $$z = m = \frac{n}{m}.$$

Note that a y-bit selector address is not needed as only one ordered partition is used; that is, y=0. (However, the y-bit input would allow additional subsets to be generated from additional partitions.) Thus, for the MU-B decoders $$x_0 = \log m = \log \sqrt{n} = \log \frac{n}{m} = x_1,$$

and $$z_0 = m = \sqrt{n} = \frac{n}{m} = z_1,$$

and $y_0 = y_1 = 0$; also $n_0 = n_1 = n$. Both MU-B decoders use a single partition, hardwired into their respective mapping units, as shown in FIGS. 22 (a) and (b).

The cost of each MU-B decoder is the cost of a $\sqrt{n} \times \sqrt{n}$ LUT with a MUB (½ log $\sqrt{n}$, 0, n, 0,1) which is $\theta(n)$. Clearly, increasing $y_0$ and $y_1$ to any constant will increase the number of subsets produced without altering the $\theta(n)$ gate cost.

Two smaller log $\sqrt{n}$-to-$\sqrt{n}$1-hot decoders arranged as shown in this example will also produce a larger log n to 1-hot decoder with O(n) cost (this is elaborated upon further below). However, the MU-B decoder approach offers room for additional partitions and hence additional subsets (within the same asymptotic cost) and considerably higher flexibility.

4.4.2 Parallel Fixed One-Hot Decoder

If the application calls for just a fixed one-hot decoder, a MU-B decoder could be much too expensive. Here the ideas presented for a parallel MU-B decoder are adapted to a fixed one-hot decoder. Let $D_0$ and $D_1$ be two instances of a ½ log n-to-$\sqrt{n}$ one-hot decoder (see FIG. 23 for an example with n=4). Assume that ½ log n is an integer. For i=0,1, let the outputs of $D_i$ be $p_j^i$, where $0 \le j < \sqrt{n}$. That is, if the input to $D_i$ (expressed as a binary number) is j, then $p_j^i = 1$ (or active); otherwise, $p_j^i = 0$ (or inactive). Fan each of these sets of outputs to n-bit positions $q_j^i$ as follows. For $0 \le j < \sqrt{n}$ and $0 \le k < n$, $$q_k^0 = p_l^0,$$

where $$l = \left\lceil \frac{k}{\sqrt{n}} \right\rceil$$

$$q_k^1 = p_m^1$$

where $$m = k \bmod \sqrt{n}$$

These outputs are the same as those illustrated in Table 12. Therefore, the log n-to-n one-hot decoder outputs $\tau_k$ (where $0 \le k < n$ can be obtained as $\tau_k = q_k^0$ AND $q_k^1$.

FIG. 23 illustrates this. Since a conventional log n-to-n one-hot decoder has 0(log n) delay and 0(n log n) gate cost, decoders $D_i$ each has 0(log n) delay and 0($\sqrt{n}$ log n) gate cost. Each of the $2\sqrt{n}$ fan-outs is of degree $\sqrt{n}$ so this has 0(log n) delay and 0($\sqrt{n}\sqrt{n}$)=0(n) gate cost. The last step of ANDing the two set of n bits clear las constant delay and 0(n) gate cost. (Note if an active-low convention is adopted for the decoder, the above AND gates would be replaced by OR gates.)

Overall, this implementation of a one-hot decoder has 0(log n) delay and 0(n) gate cost. Compared to the conventional implementation of a one-hot decoder exemplified in FIG. 5, our design has comparable delay, but a lower order of cost. In fact, since n outputs are required, this asymptotic gate cost cannot be improved upon.

4.4.3 General Structure of a Parallel Mapping-Unit-Based Configurable Decoder

In general, a P-element parallel configurable decoder MUB(x,z,y,n,$\alpha$,P) is shown in FIG. 24. As shown, P decoders "receive" all x+y input bits. In use, each decoder $CD_i$, where $0 \le i < P$, selects a portion $x_i$ and $y_i$ of the input bit streams x and y, respectively, as the input and selection information.

Two decoders, say $MUB_i$ and $MUB_j$ may use the same input bit(s) or share some common input bit(s) for their LUTs. Therefore, $x_i \le x$ and $\Sigma_{i=0}^{P-1} x_i \ge x$, as each input bit is assumed to be used at least once. Similarly, $y_i \le y$ and $\Sigma_{i=0}^{P-1} y_i \ge y$.

The merge unit could perform functions ranging from set operations (where $n_i = n$, for all i) to simply rearranging bits (when $\Sigma_{i=0}^{P-1} n_i = n$). The (optional) control allows the merge unit to select from a range of options.

Clearly, each $MUB_i$ can produce its own independent set of $n_i$-bit outputs. The manner in which these outputs combine depends on the merge unit. For example, let each $MUB_i$ produce an n-bit output (that is, a subset of $Z_n$,) and let $S_i$ be the independent set of subsets produced by $MUB_i$. Let the merge operations be $\circ$, an associative set operation with identity $S\circ$. Intersection, Union, and Ex-OR represent such an operation with $Z_n$, $\emptyset$, and $\emptyset$, respectively, as identities. If each $MUB_i$ produces a set of subsets $S_i$ that includes $S\circ$, then the whole parallel MU-B decoder produces an independent set that includes $\cup_{i=0}^{P-1} S_i$.

Let MUBi have a delay of $D_i$ and a gate cost of $G_i$. If $D_M$ and $G_M$ are the delay and gate cost of the merge unit, then the delay D and gate cost G of the parallel MU-B decoder MUB (x,z,y,n,$\alpha$,P) are $$D = \max(D_i) + D_M + 0(\log P).$$

$$G = \left(\sum_{i=0}^{P-1} G_1\right) + G_M + 0(P(x+y)).$$

If the merge unit uses simple associative set operations (such as Union, Intersection, Ex-OR) that correspond to bit-wise logical operations, then $D_M = 0(\log P)$ and $G_M = O(nP)$. Since $x+y \leq n$, the overall cost and delay for this structure is $$D = \max(D_i) + 0(\log P).$$

$$G = \left(\sum_{i=0}^{P-1} G_i\right) + nP.$$

4.5 Other Decoder Variants

The other variants of the MU-B decoder include a serial MU-B decoder and one based on a recursive bit-slice mapping unit. These variants are not preferred as they did not provide any additional benefit over the designs included by a stand alone mapping-unit-based decoder.

A serial MU-B decoder is shown in FIG. 25. Two or more mapping units are cascaded to construct the subsets of $Z_n$. Note that the independent subsets produced by the second mapping unit are dependent on what is provided to it, that is, the range of values of $z_1$, which is in turn dependent on the number of independent subsets produced by the first mapping unit. Thus, since the first mapping unit in FIG. 25 can produce $2^{y_0}$ ($\log z_0$) independent subsets, where $z_0$ is a relatively small value, a single LUT can usually subsume both the LUT and the first mapping unit in the serial variant, and be within the gate cost of the second mapping unit and provide more independent subsets. In a recursive bit-slice mapping unit, illustrated in FIG. 26, where two or more bit slice mapping units are nested within one another, such that an input to the first bit-slice mapping unit is broken down by a factor of $\alpha_0$ then broken down further by a factor of $\alpha_1$, and so on, until it reaches the lowest level mapping unit. It is then reconstructed to an n-bit output. However, this reconstruction requires a large number of shift registers and multiple clocks, and the linear reduction of cost does not provide additional benefit from that of a single bit-slice mapping unit.

4.6 Applications for MU-B Decoders

Besides FPGAs and other reconfigurable computing platforms, applications of the MU-B decoder include sensor networks and external power controllers. Typical sensor networks consist of a collection of small sensor nodes (motes) that communicate to a base station through a distributed wireless network. Because the range of individual nodes is small, outlying nodes must relay their data to the base station through closer nodes. A large amount of power is expended during the receiving and transmission of data. Because of this, data must be compressed or encoded in some fashion so as to conserve power. This situation is similar to the pin limitation problem, wherein a large amount of data must be compressed in some fashion to pass through a small number of I/O pins. A decoder-based solution to the pin limitation problem could easily be applied to sensor networks, as the decoder itself would require no significant changes to the architecture of the sensor and would act as a method of compression for the data. A configurable decoder (and a reverse encoder) can serve to reduce the number of bits transmitted between sensor nodes without requiring a drastic redesign of the sensor nodes.

Power management and low-power operation have become driving factors in many applications (for instance, the design of embedded systems). An external power controller can reduce the clock frequency of a chip such that the overall power consumed by the chip is reduced. Used indiscriminately, this method can unnecessarily hurt the performance of the chip, as not all parts of the chip may require a reduction in power. A "smart" power controller could select portions of a chip for reductions in power, reducing the performance of only those portions that are not necessary for the chip's current execution. Thus, the overall power draw of the chip would be reduced without drastically affecting the performance. However, this ability is hampered by the large number of I/O pins that would be necessary for such addressing. A decoder-based solution that would allow efficient addressing of portions of a chip through a small number of I/O pins would directly address this problem. As the configurable decoder works to select a subset, this selection can be used by a smart agent that observes data from a collection of chips and issues commands to selectively power-down portions of these chips. A sharp focused selection (such as that afforded by the configurable decoder) could be useful in this environment.

What is claimed is:

1. An apparatus comprising: a circuit having a decoder in combination with a bit-slice mapping unit, where the circuit has as input an x-bit input word having a binary value at each x-bit position, where the x-bit input word is input into the decoder which has a z-bit source word output having binary value at each z-bit position, where the z-bit source word is input into the mapping unit which also receives y-bit selector address input from outside the circuit, where the circuit outputs an $$\left(\frac{n}{\alpha}\right)\text{-bit}$$

output word having a binary value at each $$\left(\frac{n}{\alpha}\right)\text{-bit}$$

position, $$\frac{n}{\alpha}$$

being an integer and $\alpha$ is an integer $\geq 2$, where n>z>x, where each $$\left(\frac{n}{\alpha}\right)\text{-bit}$$

position is hardwire connectable to a subset of said z-bit positions (the "Mapping Subsets") of the z-bit source word.

2. The apparatus of claim 1, wherein said mapping unit periodically forms $$\frac{n}{\alpha}$$

words from said z-bit source word periodically, and stores a selected number of said formed $$\frac{n}{a}$$

words.

3. The apparatus according to claim 2, wherein said periodical formation of said $$\frac{n}{a}\text{-bit}$$

word is initiated by a clock cycle.

4. The apparatus of claim 1, wherein said mapping unit stores $\alpha$ of said $$\frac{n}{\alpha}$$

words, and combines said $\alpha$ stored $$\frac{n}{a}$$

words into an n-bit output word.

5. The apparatus of claim 1, where the binary value of each bit position of said $$\left(\frac{n}{\alpha}\right)\text{-bit}$$

output word is set as the binary value, or the complemented binary value, of a selected one of said z-bit positions in its Mapping Subset.

* * * * *